US008751729B2

(12) United States Patent
Mun et al.

(10) Patent No.: US 8,751,729 B2
(45) Date of Patent: Jun. 10, 2014

(54) FLASH MEMORY DEVICE AND MEMORY SYSTEM INCLUDING THE SAME

(75) Inventors: Kui-Yon Mun, Hwaseong-si (KR); Jongkeun Ahn, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 207 days.

(21) Appl. No.: 13/326,820

(22) Filed: Dec. 15, 2011

(65) Prior Publication Data

US 2012/0166714 A1 Jun. 28, 2012

Related U.S. Application Data

(60) Provisional application No. 61/426,529, filed on Dec. 23, 2010.

(30) Foreign Application Priority Data

Jan. 3, 2011 (KR) ........................ 10-2011-0000279

(51) Int. Cl.
*G06F 12/02* (2006.01)
*G06F 3/06* (2006.01)

(52) U.S. Cl.
CPC .......... *G06F 12/0246* (2013.01); *G06F 3/0679* (2013.01)
USPC ........................................... 711/103; 711/154

(58) Field of Classification Search
CPC ........................... G06F 12/0246; G06F 3/0679
USPC .................................................. 711/103, 154
See application file for complete search history.

(56) References Cited

U.S. PATENT DOCUMENTS

2009/0204824 A1* 8/2009 Lin et al. ........................ 713/193
2010/0259983 A1* 10/2010 Yoon ........................ 365/185.12

* cited by examiner

*Primary Examiner* — Than Nguyen
(74) *Attorney, Agent, or Firm* — F. Chau & Associates, LLC

(57) ABSTRACT

A method of controlling a memory, determining whether data access is random; generating a first random sequence (RS) data based on a first seed if data access is not random (column offset=0); mixing the first RS data with data read from the memory or data to be written to the memory; generating a second seed from a first seed if data access is random (column offset not=0); generating a second RS data based on the second seed; and mixing the second RS data with data read from the memory or data to be written to the memory.

44 Claims, 25 Drawing Sheets

Fig. 9

FLASH MEMORY DEVICE AND MEMORY SYSTEM INCLUDING THE SAME

CROSS-REFERENCE TO RELATED APPLICATIONS

This application claims priority from U.S. Provisional Application No. 61/426,529 filed on Dec. 23, 2010 and claims priority under 35 U.S.C. §119(a) from Korean Patent Application No. 10-2011-0000279 filed on Jan. 3, 2011. The disclosures in the above-cited applications are incorporated by reference herein.

TECHNICAL FIELD

Exemplary embodiments relate to a semiconductor memory, and in particular, to a flash memory device.

DISCUSSION OF THE RELATED ART

A flash memory device is a type of EEPROM that a plurality of memory regions are erased or programmed by one program operation. A conventional EEPROM enables only one memory region to be erased or programmed once. A flash memory device can be operated more rapidly if different memory regions can be written simultaneously. All types of flash memory and EEPROM may wear out after a predetermined number of erase operations due to wearing-out or deterioration of an insulation film surrounding a charge storing means used to store data.

A flash memory device stores information on a silicon chip in such a way that power is not needed to retain information stored on a silicon chip. Additionally, a flash memory device provides the resistance to physical impact and relatively fast read access times. For such characteristics, a flash memory device is generally used for storage of battery-powered devices.

SUMMARY

One embodiment of the inventive concept is directed to provide randomizer method and device with respect to random data executed according to an initial seed which is generated based on an offset address.

According to an embodiment of the inventive concept, a method of controlling a memory, comprises: determining whether data access is random; generating a first random sequence (RS) data based on a first seed if data access is not random; mixing the first RS data with data read from the memory or data to be written to the memory; generating a second seed from a first seed if data access is random; generating a second RS data based on the second seed; and mixing the second RS data with data read from the memory or data to be written to the memory.

According to an embodiment of the inventive concept, the first seed is based on one of row address, page address, block unit, or sector unit. The data access is random access when column address is nonzero.

According to an embodiment of the inventive concept, the generating the second RS data includes RS data that satisfy a $1+x^{xK-1}+x^{xk}$ polynomial. According to an embodiment of the inventive concept, K=11.

According to an embodiment of the inventive concept, the method further including using a first seed for a first segment, a second seed generated based on the first seed for an intermediate segment, and a third seed generated based on the first or second seed for generating RS data for a third segment.

According to an embodiment of the inventive concept, the data to be written is received from an I/O pin and the mixed data is output to a page buffer.

According to an embodiment of the inventive concept, a method of controlling a memory, comprises: receiving an offset value N, N being a column portion of an access address; generating M random sequence (RS) data prior to derandomizing first read data based on the access address, wherein the maximum value of M is N; and derandomizing the first read data by mixing with the Nth RS data.

According to an embodiment of the inventive concept, M=N.

According to an embodiment of the inventive concept, the method includes accelerating the generating M RS data by selecting a RS data string path that includes pre-shifted outputs.

According to an embodiment of the inventive concept, a method of controlling a memory comprises: receiving an offset value N, N being a column portion of an access address; generating M random sequence data prior to derandomizing first read data based on the access address, wherein M is a range from 1 to less than the end of the column portion of the access address; and derandomizing the first read data using the Nth RS data.

According to an embodiment of the inventive concept, a memory device comprises: a flash memory cell array; a random sequence (RS) data generator configured to generate at least one RS data string based on a first seed; a randomizing circuit configured to mix the RS data with data to be written to the flash memory cell array; a derandomizing circuit configured to derandomize data read from the flash memory cell array; and a control circuit configured to control access to the flash memory cell array including activating the RS data generator based on memory access mode, wherein the randomizing circuit and the derandomizing circuit are disposed between a page buffer and an I/O pin.

According to an embodiment of the inventive concept, a portion of memory address is used as the first seed in one mode and a second seed is generated by the RS data generator in a second mode. The RS data generator is configured to generate RS data that satisfy $1+x^{k-1}+x^k$ polynomial.

According to an embodiment of the inventive concept, the RS data generator is configured to output at least one preset RS data upon receipt of an acceleration signal.

According to an embodiment of the inventive concept, a memory system comprising: a memory device comprising: a flash memory cell array; a random sequence (RS) circuit configured to generate RS data; and a mixer configured to mix random sequence RS data with data to be written to the flash memory cell array and to derandomize data read from the flash memory cell array; and a memory controller comprising control circuit configured to control writing to and reading from the flash memory cell array through the mixer.

According to an embodiment of the inventive concept, the memory system further including at least another memory device comprising a flash memory cell array and a random sequence circuit configured to mix random sequence RS data with data to be written to the flash memory cell array and to derandomize data read from the flash memory cell array.

According to an embodiment of the inventive concept, the memory controller further includes an error control circuit (ECC) configured to perform error correction functions when reading data from the flash memory cell array.

According to an embodiment of the inventive concept, the flash memory cell array is a MLC type.

According to an embodiment of the inventive concept, the memory device is embodied in an SSD card.

According to an embodiment of the inventive concept, the memory device and the memory controller are embodied in an SSD card.

According to an embodiment of the inventive concept, the memory system further includes a processing device configured to control the SSD card and at least another SSD card.

According to an embodiment of the inventive concept, the memory system further including a server configured to control the SSD card and a RAID controller configured to control another SSD card including parity management functions.

According to an embodiment of the inventive concept, the memory system further including a host processing device configured to communicate with the plurality of SSD cards.

According to an embodiment of the inventive concept, the memory system further including wireless transceivers configured to wirelessly communicate between the host processing device and the plurality of SSD cards.

According to an embodiment of the inventive concept, the memory system including a network connecting a plurality of processing devices and the plurality of SSD cards.

According to an embodiment of the inventive concept, the memory system further including a cellular transceiver configured to communicate with a cellular network.

According to an embodiment of the inventive concept, the memory system further including an image sensor configured to capture images.

According to an embodiment of the inventive concept, a memory device comprises: a flash memory cell array; a random sequence (RS) data generator configured to generate at least one RS data string based on a first seed; a mixer configured to derandomize data read from the flash memory cell array; and a control circuit configured to control access to the flash memory cell array including activating the RS data generator based on memory access mode, wherein a portion of memory address is used as a first seed in one mode and a second seed is generated by the RS data generator in a second mode.

According to an embodiment of the inventive concept, the mixer is further configured to randomize data to be written to the flash memory cell array with RS data.

According to an embodiment of the inventive concept, the mixer is configured to receive data read from the flash memory cell array through a page buffer and the derandomized data is output via an I/O pin.

According to an embodiment of the inventive concept, the control circuit is configured to generate an intermediate seed based on the first seed and RS data is generated based on the intermediate seed.

According to an embodiment of the inventive concept, the flash memory cell array includes multiple levels cell (MLC) type flash, and the mixer is configured to mix multi-value data by bit-wise XOR operation.

BRIEF DESCRIPTION OF THE DRAWINGS

The above and other features will become apparent from the following description with reference to the following figures, wherein like reference numerals refer to like parts throughout the various figures unless otherwise specified, and wherein

FIG. 9 is a diagram showing initial seed values generated using a polynomial of a PSR illustrated in FIG. 7.

DETAILED DESCRIPTION

Figure 1:
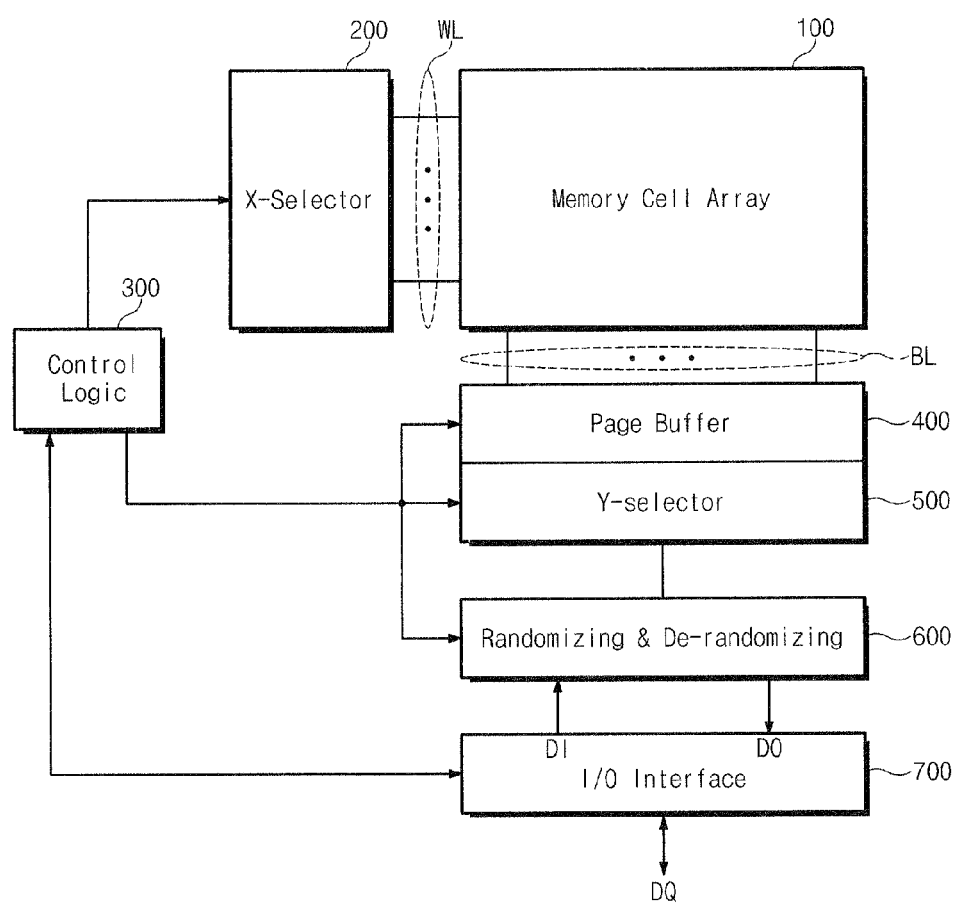
FIG. 1 is a block diagram showing a flash memory device according to an exemplary embodiment of the inventive concept.

The inventive concept is described more fully hereinafter with reference to the accompanying drawings, in which embodiments of the inventive concept are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

FIG. 1 is a block diagram showing a flash memory device according to an exemplary embodiment of the inventive concept.

Referring to FIG. 1, a flash memory device includes a memory cell array 100 which has memory cells arranged in rows (word lines: WL) and columns (bit lines: BL). Each memory cell may store a 1-bit data or M-bit (multi-bit) data (M being an integer of 2 or more). Each memory cell may be formed of a memory cell having a charge storing layer such as a floating gate or a charge trap layer or a memory cell having a variable resistance element. The memory cell array 100 may be formed to have a single-layer array (two-dimensional) structure or a multi-layer array structure, which is also referred to as a vertical-type or a stack-type three-dimensional array structure. The memory device may be a NAND type flash memory.

A row selector circuit 200 is controlled by control logic 300 and is configured to perform selection and driving operations on rows of the memory cell array 100. The control logic 300 is configured to control an operation of the flash memory device overall. A page buffer circuit 400 is controlled by the control logic 300 and operates as a sense amplifier or a write driver according to a mode of operation. For example, during a read operation, the page buffer circuit 400 operates as a sense amplifier which senses data from memory cells connected to a selected row of memory cells. During a program operation, the page buffer circuit 400 operates as a write driver which drives data into memory cells connected to a selected row. The page buffer 400 may include page buffers each corresponding to bit lines or bit line pairs. If each memory cell stores multi-bit data, each page buffer of the page buffer circuit 400 may be configured to have two or more latches.

Continuing to refer to FIG. 1, a column selector circuit 500 is controlled by the control logic 300 and sequentially selects columns (or, page buffers) by a predetermined unit at a read/program operation. A randomizer (hereafter referred to as "randomizer") circuit 600 is configured to randomize data to be programmed, which is transferred via an input/output interface 700, e.g. to and from an I/O pin(s). The randomizer circuit 600 is configured to de-randomize data received from the page buffer circuit 400, which is transferred via the column selector circuit 500, according to the control of the control logic 300. Accordingly to the embodiment, the derandomized data is output via the input/output interface 700 which includes input/output pins to circuits external to the flash memory device. The randomizer circuit 600 according to an exemplary embodiment of the inventive concept is configured to perform randomizer operations with respect to not only full-page data but also random data less in amount than the full-page data (for example, data of a spare region, sector data, data more than sector data and less than page data, data less than sector data, etc.). This will be more fully described below.

A memory cell may be a multi-level cell (MLC) that stores a number of data bits. The MLC has one of threshold voltage distribution according to the amount of charges stored in its charge storing means. When such threshold voltage distribution change due to charge loss or coupling (called the word line coupling) between adjacent memory cells, error-free access to/from the memory cell is impacted due to decreased margins. The variation of threshold voltage distributions is worsen if there are frequent data pattern of strings of "0" or "1". Data randomizing (i.e., mixing data with a random sequence) can reduce the variation of threshold voltages of memory cells due to the word line coupling. In other words, since states of memory cells are distributed more uniformly, the occurrence of word line coupling may be reduced as compared with before data randomization.

In some embodiments, the randomizer operations may be performed selectively. For example, when an access to specific data or a specific region is requested, the randomizer circuit 600 is configured to perform its randomizer operations.

Figure 2:
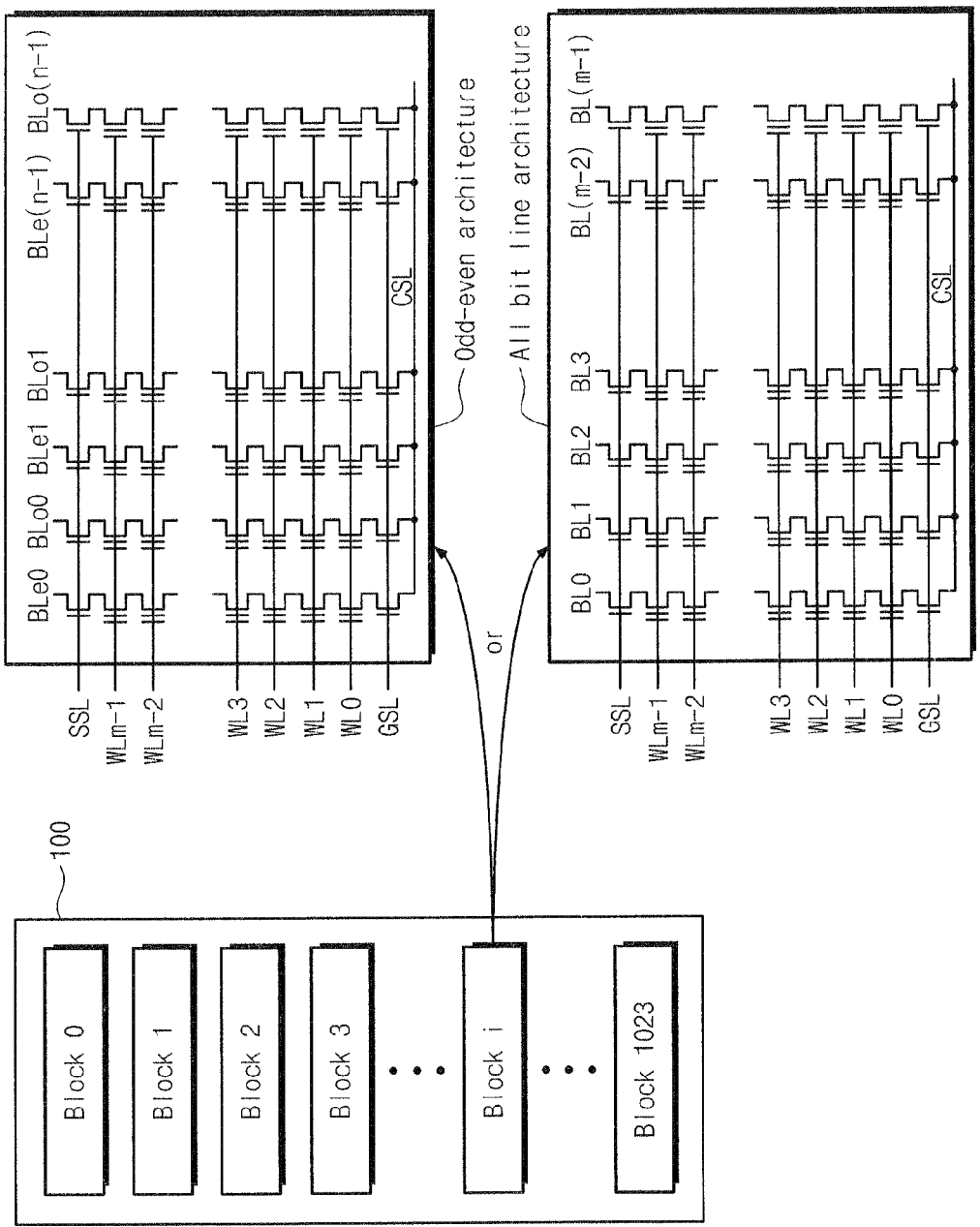
FIG. 2 is a diagram showing an example that a memory cell array illustrated in FIG. 1 is formed of memory blocks for the all bit line memory structure or the odd-even memory structure.

FIG. 2 is a diagram showing an example that a memory cell array illustrated in FIG. 1 is formed of memory blocks for the all bit line memory structure or the odd-even memory structure. Exemplary structures of a memory cell array 100 will be described. As one example, a NAND flash memory device including a memory cell array 100 partitioned into 1,024 blocks will now be described. The data stored in each block may be simultaneously erased or by a memory sub-block unit. In one embodiment, the memory block or memory sub-block is the minimum unit of storage elements that are simultaneously erased. Each memory block, for example, has columns corresponding to bit lines (e.g., bit lines of 1 KB). In one embodiment referred to as the all bit line (ABL) architecture, all the bit lines of a memory block are capable of being simultaneously selected during read and program operations. Storage elements in a word line selected by a row selector circuit 200 and connected to all bit lines is capable of being programmed at the same time.

In an exemplary embodiment, a plurality of storage elements in the same column is connected in series to form a NAND string. One end of the NAND string is connected to a corresponding to a bit line via a select transistor which is controlled by a string select line SSL, the other end is connected to a common source line CSL via a select transistor which is controlled by a ground select line GSL.

In another embodiment referred to as the odd-even architecture, bit lines are divided into even bit lines (BLe) and odd bit lines (BLo). In the odd/even bit line architecture, storage elements in a common word line and connected to the odd bit lines are programmed at the first time, while storage elements in the common word line and connected to even bit lines are programmed at the second time.

Figure 3:
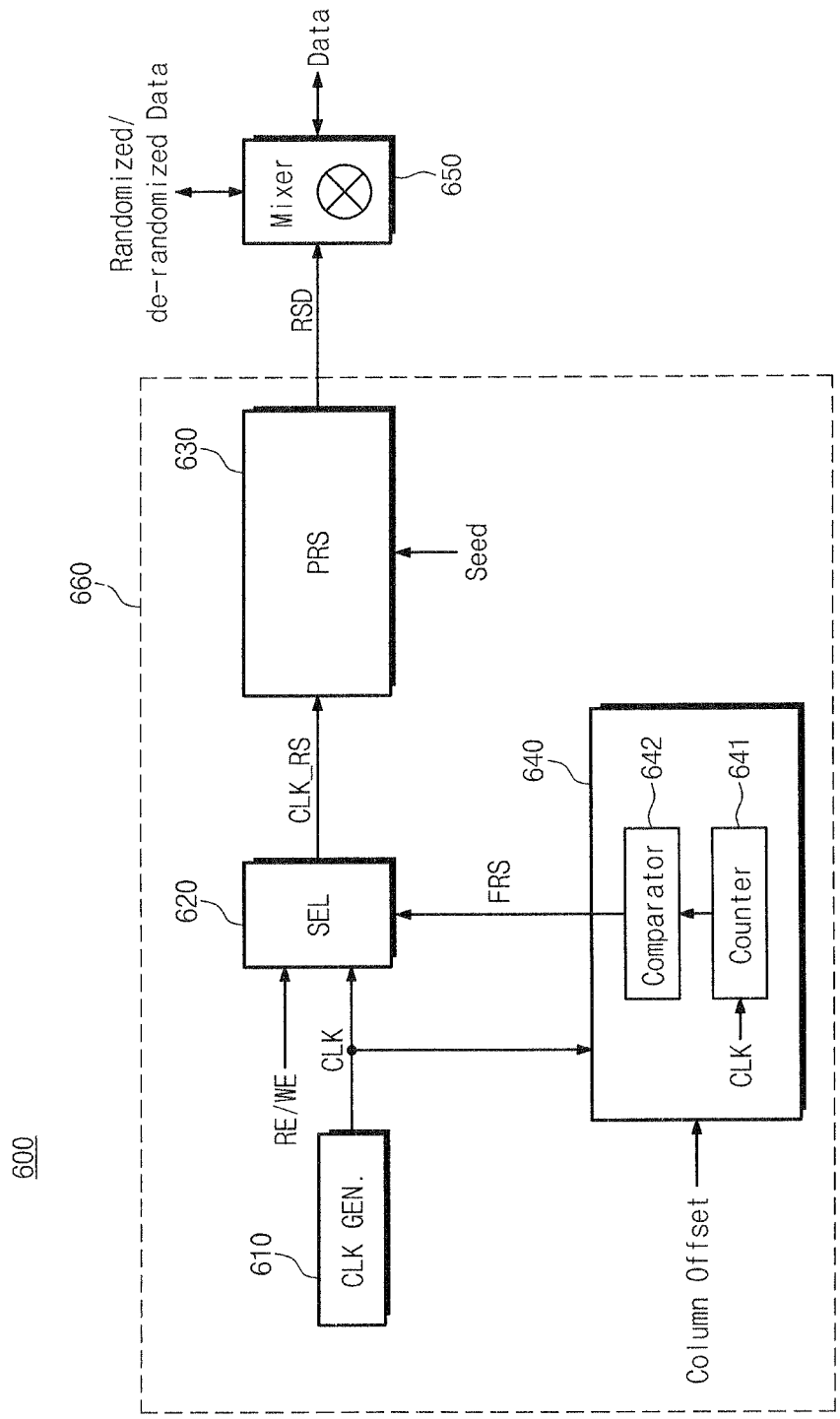
FIG. 3 is a block diagram showing a randomizer circuit in FIG. 1 according to an exemplary embodiment of the inventive concept.

FIG. 3 is a block diagram showing a randomizer circuit in FIG. 1 according to an exemplary embodiment of the inventive concept.

Referring to FIG. 3, a randomizer circuit 600 according to an exemplary embodiment of the inventive concept includes a clock generator 610, a selector 620, a pseudo-random sequence generator (PRS) 630, a free-run detector 640, and a mixer 650. Herein, data generator 660 includes clock generator 610, selector 620, PSR 630, and free-run detector 640 that are operationally coupled to sequentially generate random sequence data RSD. A group of random sequence data may form a random sequence RS. Mixer 650 is configured to combine the random sequence data RSD with data to be written into the memory cell array 100 to form randomized data. Mixer 650 is also configured to extract data that have been combined with random sequence data, such as data read from memory cell array 100 to produce derandomized data. Mixer 650 is configured to mix by binary units for single level cell type flash memories, but may also be configured to mix multi-bit values through a bit-wise operation, e.g., by a bit-wise XOR operation.

The clock generator 610 is configured to generate a clock signal CLK. The selector 620 selects either one of input signals CLK and RE/WE in response to a select signal (free-run signal) FRS received from the free-run detector 640. For example, when the free-run signal FRS is activated, the selector 620 may select the clock signal CLK from the clock generator 610 as its output signal. When the free-run signal FRS is inactivated, the selector 620 may select a read/write enable signal RE/WE. A signal CLK or RE/WE selected by the selector 620 may be provided to the PSR 630 as a random sequence clock signal CLK_RS to sequentially generate random sequence data RSD based on a predetermined seed.

In an exemplary embodiment, the predetermined seed may be formed from one of a row address, a page address, a block unit, address, or a sector unit. But, it is well understood that a manner of determining a seed is not limited to the above. According to one embodiment, when an access to any page is requested, a page address may be used as a seed provided to the PRS 630. The seed would then be a constant value provided to the PRS 630. A seed used for randomizing the first data provided to the mixer 650 or to generate initial random sequence data is called a first seed. According to an embodiment of the present inventive concept, a sector unit of a page may also be used as an initial seed, with reference to row and column addresses.

In an exemplary embodiment, the PSR 630 may be implemented with a linear feedback shift register (LFSR), which may be formed from one shift register and one or more XOR logic gates. But, it is well understood that the PSR 630 can be formed from a pseudo-random number (PN) sequence generator, a cyclic redundancy code (CRC) generator, or the like.

Continuing to refer to FIG. 3, the free-run detector 640 generates the free-run signal FRS based on a column offset value. In an exemplary embodiment, a column offset value may be a value of a column address provided at an access request. According to one embodiment, when a read/write operation on full-page data is requested, a column offset value may be '0'. When a 'random' access operation is requested, a column address, or offset value, is nonzero. For example, the first access point of page data is determined by a column address having an address value of '0', and remaining access points of the page data are determined by a column address having a value more than '0', respectively. Herein, a data read-out location may include a column location of a page buffer circuit 400 or a column location of one page. Likewise, a location in which data is stored according to an access request (or an access point) may be determined variously through a column address. A column offset value or an offset address can be used interchangeably herein.

The free-run detector 640 includes a counter 641 and a comparator 642. The counter 641 may operate in synchronization with the clock signal CLK generated by the clock generator 610. The comparator 642 compares a count value of the counter 641 and a column offset value to generate the free-run signal FRS according to a comparison result. For example, the free-run signal FRS may be inactivated when an initial value of the counter 641 is identical to a column offset value. The free-run signal FRS may be activated when the initial value of the counter 641 is different from the column offset value. In case of the latter, the comparator 642 may inactivate the free-run signal FRS when a count value of the counter 641 reaches the column offset value.

The counter 641 does not operate when a column offset value is '0' at a read/write operation, and the free-run signal FRS is inactivated. Inactivation of the free-run signal FRS means that a requested access is related to full-page data. In this case, the read/write enable signal RE/WE is selected and an RE/WE toggled at a data input/output may be provided to the PSR 630 through the selector 620. The read/write enable signal RE/WE may be toggled to provide data to the mixer 650 at a read/write request.

The counter 641 performs a count operation when a column offset value is not '0' at a read/write operation. That is, when a column offset value is not identical to an initial value of the counter 641, the free run detector 640 performs a count operation in synchronization with the clock signal CLK and activates the free-run signal FRS. Activation of the free-run signal FRS means that a requested access is related to random data. In this case, the clock signal CLK generated by the clock generator 610 is selected by selector 620 and provided to the PSR 630 with a clock signal CLK selected, the PSR 630 may sequentially generate random sequence data in synchronization with the clock signal CLK. An operation of generating initial random sequence data for substantial randomizing of the first data is called a free-run operation. When a count value reaches a volume offset value, the free-run detector 640 inactivates the free-run signal FRS. When a state of the free-run signal FRS transitions from an active state to an inactive state, the read/write enable signal RE/WE toggled at a data input/output may be provided to the PSR 630 through the selector 630 as the random sequence clock signal CLK_RS.

The mixer 650 performs both randomizing and derandomizing functions. For example, at a read operation, the mixer 650 logically combines random sequence data RSD with randomized data read from the memory cell array through page buffer 400 and column selector circuit 500 to output derandomized data to an input/output interface 700. At a write operation, the mixer 650 logically combines random sequence data RSD with data provided via the input/output interface to output the combined data as randomized data to the column selector circuit 500 to be written into the memory cell array 100. The mixer 650 may include logic circuits, such as exclusive-or gates, to implement, a logical additional function. In the event that byte-unit data is provided to the mixer 650, a random sequence data bit may be combined logically with each of data bits being read/programmed.

The free-run signal FRS may have either one of an active-high level and an active-low level according to whether a requested access is a random data access.

Figure 4:
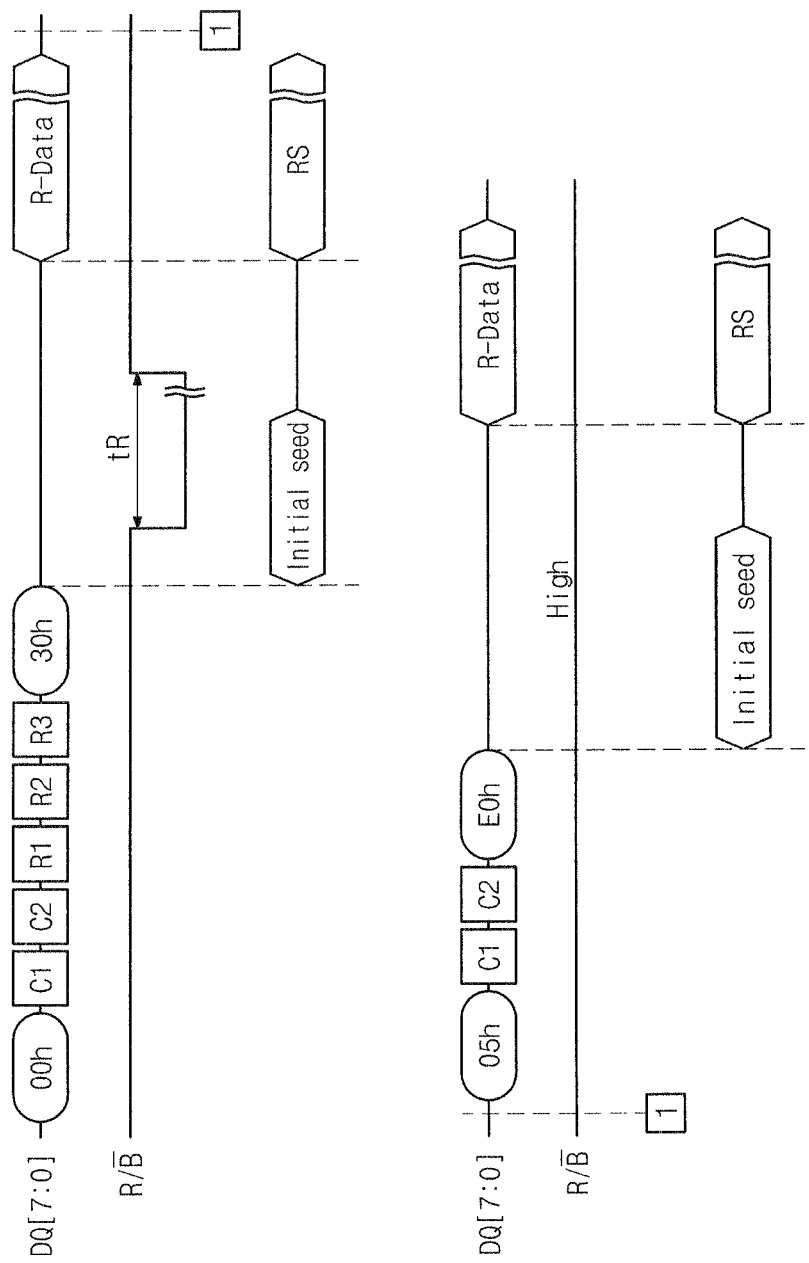
FIG. 4 is a timing diagram for describing a read operation of a flash memory device according to an exemplary embodiment of the inventive concept.

FIG. 4 is a timing diagram for illustrating a read operation of a flash memory device according to an exemplary embodiment of the inventive concept.

A read operation may be carried out according to an input of a set of commands and addresses. For example, as illustrated in FIG. 4, the first command 00h, an address C1C2R1R2R3, and the second command 30h may be provided sequentially to a flash memory device. The provided address C1C2R1R2R3 may include a column address C1C2 and a row address R1R2R3. Since a column offset value is the column address C1C2 not '0', data access is random, and an initial random sequence data may be generated using the row address R1R2R3 as a seed. Alternatively, when randomizing is applied by a unit less than one page, a column address, or a sector address can be used as a start seed to generate an intermediate seed to in turn generate random sequence data to derandomize data read from the flash memory cell array.

After the second command 30h is provided to the flash memory device, during tR, a page buffer circuit 400 reads out data from a memory cell array 100 in response to the control of control logic 300. As illustrated in FIG. 4, a ready/busy signal R/B̄ may be maintained at a low level during tR. Since the column offset value is not '0' the initial value of counter 641, the free-run detector 640 activates the free-run signal FRS. This means that clock signal CLK is selected through selector 620 and provided to PSR 630. The PSR 630 generates initial random sequence data using the row address R1R2R3 as seed. The counter 641 starts to count according to the clock signal CLK upon input of the second command 30h.

The column address, column offset value, is loaded into the comparator 642. When the count value of the counter 641 reaches the column offset value, the comparator 642 inactivates the free-run signal FRS. As the free-run signal FRS is inactivated, clock signal CLK is not selected by selector 620 and the free-run operation is stopped. At this time, the PSR 630 is provided the initial random sequence data as seed for randomizing of the first data. After the time tR elapses, data of the page buffer circuit 400 (that is, randomized data) may be provided to a randomizer circuit 600 via a column selector circuit 500 according to toggling of a read/write enable signal RE/WE. At this time, the PSR 630 may generate random sequence data RSD sequentially in synchronization with the toggling of the read/write enable signal RE/WE. The mixer 650 logically combines the random sequence data RSD with data selected by the column address C1C2, and the combined data may be provided to an external device through an input/output interface 700 as de-randomized data. The de-randomizing operation may be repeated until access-requested data is all outputted.

Data stored in the page buffer circuit 400 may be additionally provided to the external device using a set of commands and address. In this case, as illustrated in FIG. 4, the read/busy signal R/B̄ may be maintained at a high level. For example, the first command 05h, an address C1C2, and the second command E0h may be provided sequentially to the flash memory device. At this time, the provided address only includes a column address C1C2 and no row address. Since a column offset value, same as column address C1C2, is not '0', an initial random sequence data may be generated through a free-run operation of the random sequence generating block 650 using a seed which is determined according to the previously provided row address R1R2R3, essentially as described above.

As illustrated in FIG. 4, after the second command E0h is received and a time taken to generate the initial seed elapses, data may be outputted. A time (for example, 13 us) taken to prepare an initial seed may be shorter than tR (for example, 30 us).

Figure 5:
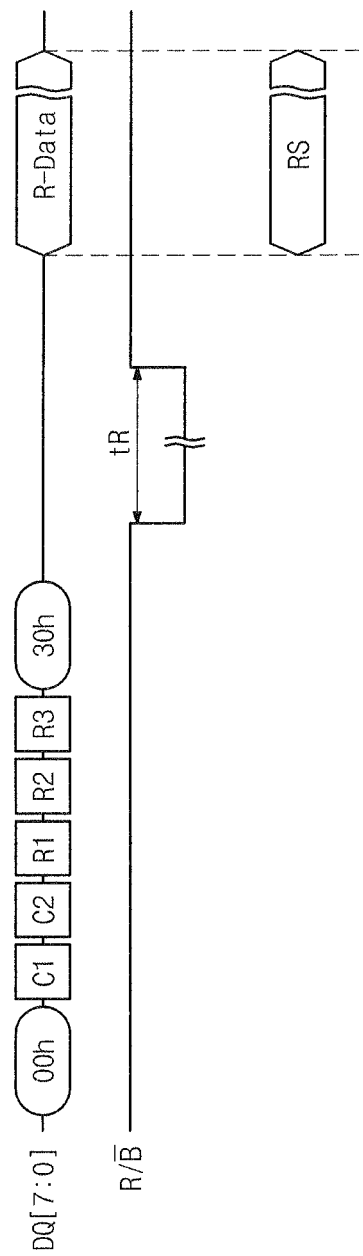
FIG. 5 is a timing diagram for describing a read operation of a flash memory device according to another exemplary embodiment of the inventive concept.

FIG. 5 is a timing diagram for describing a read operation of a flash memory device according to another exemplary embodiment of the inventive concept.

A read operation may be carried out according to an input of a set of commands and address. For example, as illustrated in FIG. 5, the first command 00h, an address C1C2R1R2R3, and the second command 30h may be provided sequentially to a flash memory device. The provided address C1C2R1R2R3 may include a column address C1C2 and a row address R1R2R3. In this case, C1C2 is '0', and the column offset value is '0'. Since a column offset value is '0', data access is not random, and a free-run operation is not performed.

After the second command 30h is provided to the flash memory device, during tR, a page buffer circuit 400 reads out data from a memory cell array 100 in response to the control of control logic 300. As illustrated in FIG. 5, a ready/busy signal R/B̄ may be maintained at a low level during tR. A randomizer circuit 600 sequentially generates random sequence data RSD using the received row address R1R2R3 as seed, and logically combines the random sequence data RSD with data read by the page buffer circuit 400. The combined data may be provided to an external device through an input/output circuit 700 as de-randomized data.

Figure 6:
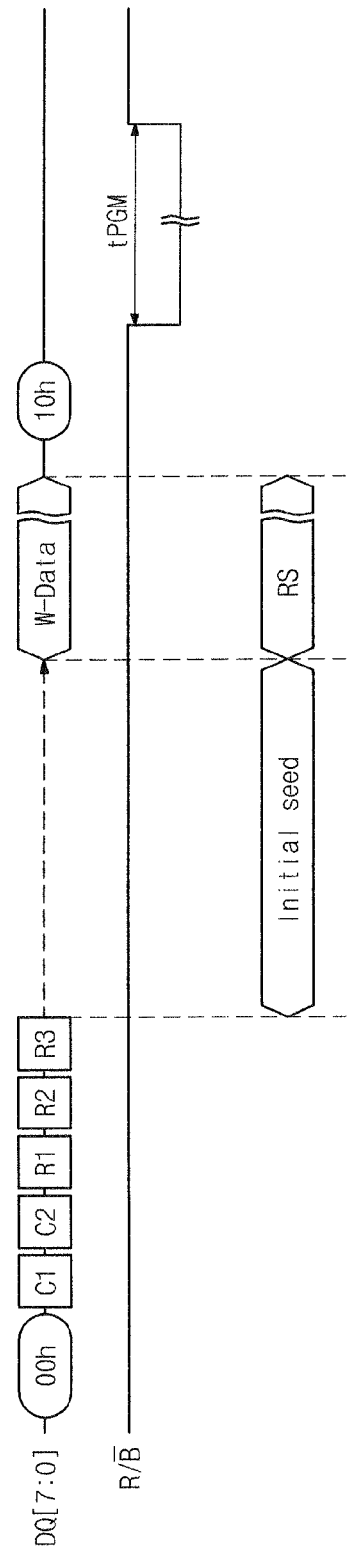
FIG. 6 is a timing diagram for describing a write operation of a flash memory device according to an exemplary embodiment of the inventive concept.

FIG. 6 is a timing diagram for describing a write operation of a flash memory device according to an exemplary embodiment of the inventive concept.

A write operation may be carried out according to an input of a set of commands and address. For example, as illustrated in FIG. 5, the first command 80h, an address C1C2R1R2R3, and the second command 10h may be provided sequentially to a flash memory device. The provided address C1C2R1R2R3 may include a column address C1C2 and a row address R1R2R3. In this case, C1C2 is not '0' and the column offset value being the value of the column address C1C2 is not '0'. Data access is random, an initial seed necessary to generate initial random sequence data may be produced using the row address R1R2R3 as a seed.

Since a column offset value is not '0', the free-run detector 640 activates the free-run signal FRS. This means that a clock signal CLK generated by a clock generator 610 is selected through a selector 620. The clock signal CLK may be provided to a PSR 630 to generate random sequence data RSD. When a count value of a counter 641 reaches a column offset value, the free-run detector 640 inactivates the free-run signal FRS. At this time, the PSR 630 may be set by an initial random sequence data which may be used as the initial seed for randomizing of the first data.

In an exemplary embodiment, at a write operation, the counter 641 may start to count following an address input.

If generation of the initial seed is ended, data to be programmed may be provided sequentially to a randomizer circuit 600 through an input/output interface 700 of the flash memory device according to toggling of a read/write enable signal RE/WE. At this time, the PSR 630 may sequentially generate random sequence data RSD in synchronization with the toggling of the read/write enable signal RE/WE. A mixer 650 logically combines the initial random sequence data with data provided through the input/output interface circuit 700, and the combined data may be transferred to a page buffer circuit 400 through a column selector circuit 500 as randomized data. The randomizing operation may be repeated until all data to be programmed is transferred to the page buffer circuit 400. Afterwards, if the second command 10h is provided to the flash memory device, as illustrated in FIG. 6, a ready/busy signal R/B̄ goes to a low level from a high level. During the low-level period of the ready/busy signal R/B̄, that is, during tPGM, data (that is, randomized data) stored in the page buffer circuit 400 may be stored in a memory cell array 100.

As described above, although an access on random data (or, a random data access) is requested, it is possible to randomize random data to be programmed by preparing an initial seed (or, initial random sequence data) using an offset address as a column offset value.

Although not illustrated in FIG. 6, in a case where a column offset value is '0' at a write operation, no free-run operation for generating an initial seed is carried out. In this case, data and the second command 10h may be provided to the flash memory device successively following an address input.

In an exemplary embodiment, a time taken to generate an initial seed may differentiate according to a column offset value. Accordingly, a point of time when data is fetched at a read operation described in FIG. 4 and a point of time when data is provided at a write operation described in FIG. 6 may be set on the basis of a maximum time taken to generate an initial seed.

Figure 7:
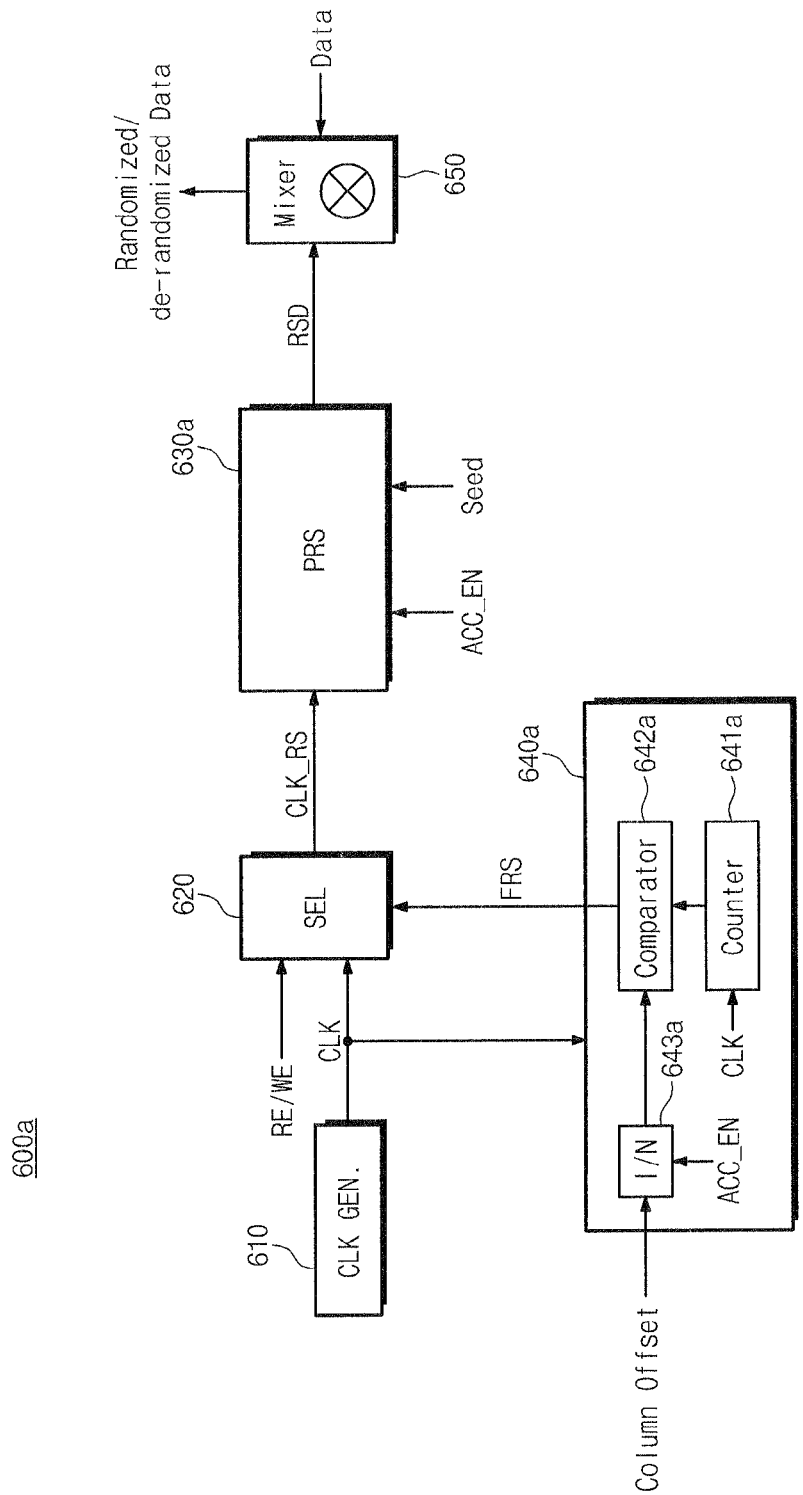
FIG. 7 is a block diagram showing a randomizer circuit in FIG. 1 according to another exemplary embodiment of the inventive concept.

FIG. 7 is a block diagram showing a randomizer circuit in FIG. 1 according to an exemplary embodiment of the inventive concept.

Referring to FIG. 7, a randomizer circuit according to another exemplary embodiment of the inventive concept includes a clock generator 610, a selector 620, a PSR 630a, a free-run detector 640a, and a mixer 650. The clock generator 610, the selector 620, and the mixer 650 are substantially identical to those in FIG. 3, and description thereof is thus omitted.

Figure 8:
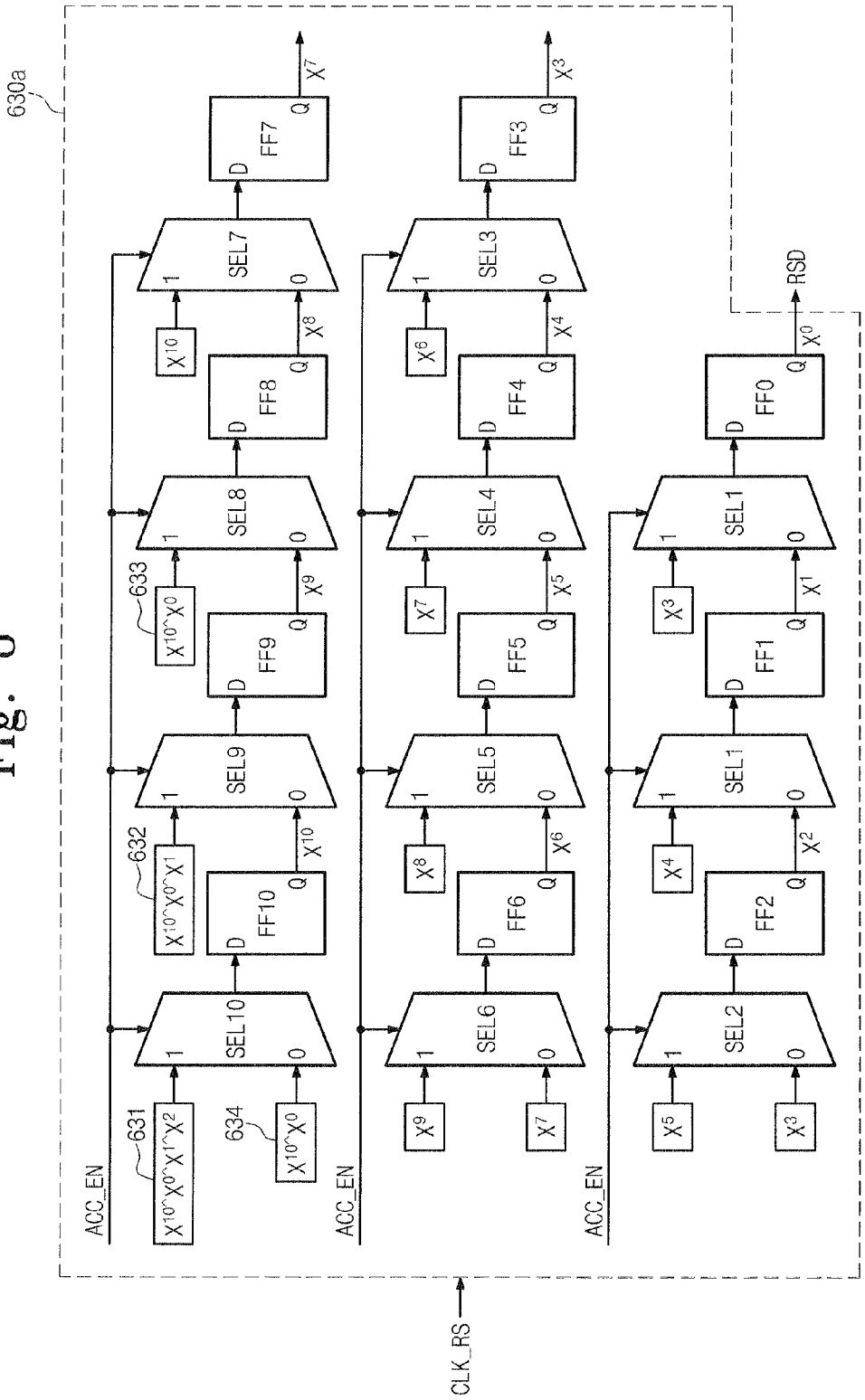
FIG. 8 is a block diagram showing a PSR illustrated in FIG. 7.
Figure 9:
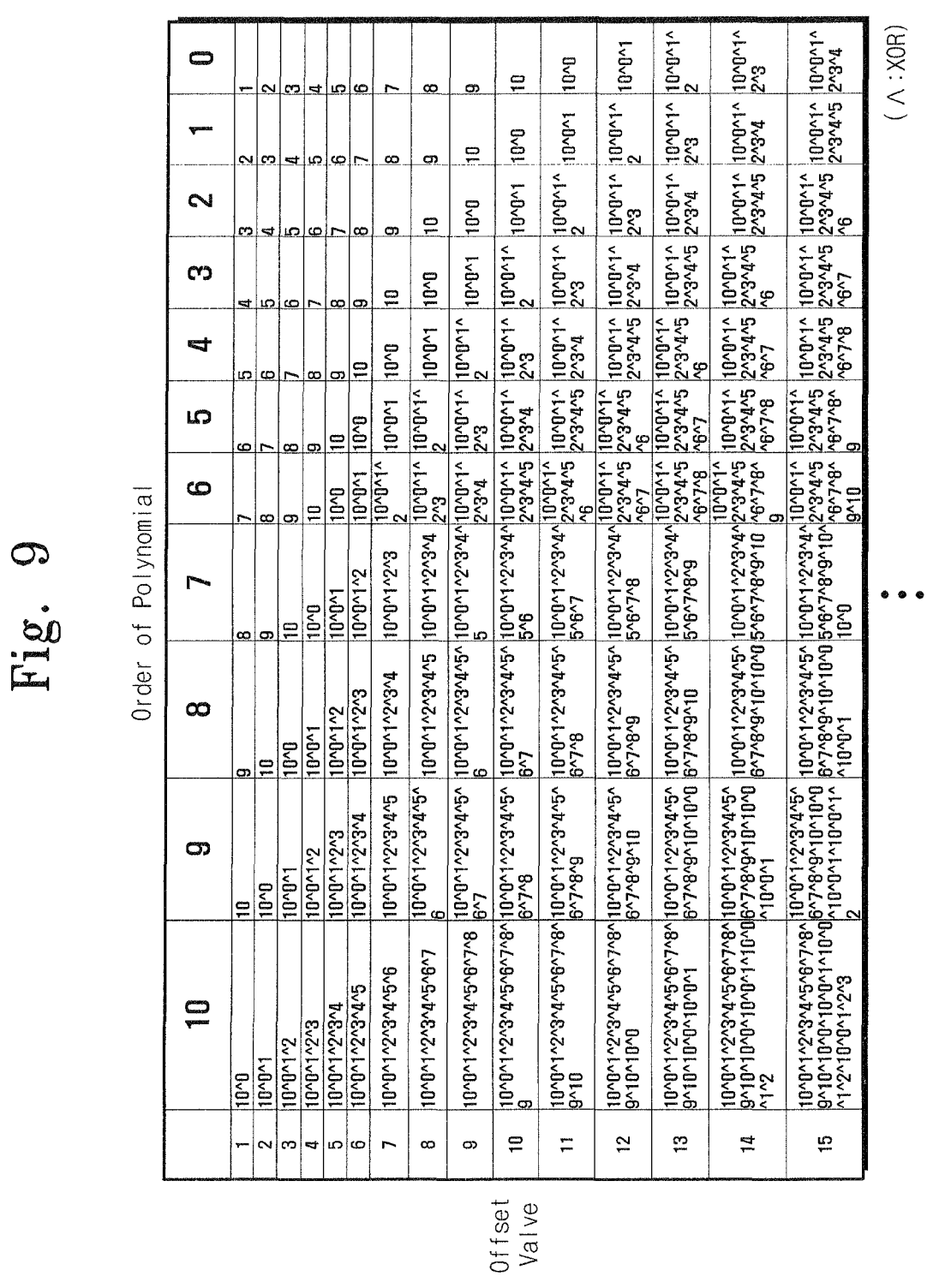

Referring to FIGS. 7 to 9, the PSR 630a of the randomizer circuit 600a may operate in one of an acceleration mode and a normal mode according to a flag signal ACC_EN indicating an acceleration mode. In an acceleration mode, pre-shifted random sequence (RS) data according to a predetermined polynomial is input for selection, for example, from a multi-plexed input port, as illustrated in FIG. 8, to be further described below. In an acceleration mode, the time needed to generate an initial random sequence data (when a column offset value is not '0') is reduced. When the flag signal ACC_EN is inactivated, the PSR 630a may operate in the normal mode.

Activation and inactivation of the flag signal ACC_EN indicating an acceleration mode may be determined based upon trim information of a flash memory device. Alternatively, activation and inactivation of the flag signal ACC_EN indicating an acceleration mode may be determined by a controller controlling the flash memory device. But, one ordinarily skilled in the art can readily appreciate that activation and inactivation of the flag signal ACC_EN indicating an acceleration mode is not limited to this disclosure. Speed information may also be determined with activation of the flag signal.

The free-run detector 640a includes a counter 641a, a comparator 642a, and a divider 643a. The counter 641a is configured to operate in synchronization with a clock signal CLK. The divider 643a operates based on the flag signal ACC_EN signally an acceleration mode. The divider 643a may transfer a column offset value directly to the comparator 642a or provides the comparator 642a with a value obtained by dividing a column offset value by speed information N. For example, when the flag signal ACC_EN indicates a normal mode, the divider 643a sends a column offset value to the divider 643a without modification. When the flag signal ACC_EN indicates an acceleration mode, the divider 643a divides a column offset value by the speed information N and provides the divided value to the comparator 642a. For example, when a column offset value is '1000' and the speed information indicates N-speed, the divider 643a will output a value of 1000/N.

The comparator 642a compares a count value of the counter 641a with an output of the divider 643a to generate a free-run signal FRS according to a comparison result. For example, the free-run signal FRS may be inactivated when an initial value of the counter 641a is identical to an output of the divider 643a. The free-run signal FRS may be activated when an initial value of the counter 641a is different from an output of the divider 643a. In the latter case, the comparator 642a may inactivate the free-run signal FRS when a count value of the counter 641a reaches an output value of the divider 643a. The counter 641a also stops count in such instance.

FIG. 8 is a block diagram showing an exemplary PSR 630a illustrated in FIG. 7, and FIG. 9 is an exemplary table listing of initial random sequence data (initial seed values) generating by the PRS generator 630a.

Referring to FIG. 8, a PSR 630a includes a plurality of flip-flops FF0 to FF10 operating responsive to a random sequence clock signal CLK_RS, a plurality of selectors SEL0 to SEL10 operating in response to acceleration flag signal ACC_EN, and a plurality of XOR logics 631, 632, 633, and 634, which are connected as illustrated in FIG. 8. According to this exemplary embodiment, the PSR 630a illustrated in FIG. 8 is configured to satisfy a polynomial $X^{11}+X^{10}+1$, and may operate in a normal or acceleration mode according to the flag signal ACC_EN. When the flag signal ACC_EN is a level indicating normal mode (e.g. a low level), the input '0' ports of selectors SELxx is selected to output to inputs D of the flip-flops FF0 to FF10, to output RS data satisfying the predetermined polynomial on a normal basis. When the flag signal ACC_EN is at a level indicating the acceleration mode (e.g., a high level), the input '1' ports of selectors SELxx is selected to pass pre-shifted RS data to inputs D of the flip-flops FF0 to FF10, for example, $X^{10 \wedge} X^{0 \wedge} X^{1 \wedge} X^2$, $X^{10 \wedge} X^{0 \wedge} X^1$, $X^{10 \wedge} X^0$, $X^{10} \sim X^3$ selected through corresponding selectors SEL0 to SEL10. According to the present exemplary embodiment as shown in FIGS. 8 and 9, the column offset value is advanced or accelerated to output, as an example, $X^3$ at SEL1 and FF0 as opposed to $X^1$, thereby eliminating two clock cycles to output the shifted RS data.

FIG. 9 shows exemplary random sequence (RS) data generated by the PRS, with the offset value (y axis) versus the order of the polynomial (x axis) RS data pursuant to a predetermined polynomial, for this embodiment $X^{11}+X^{10}+1$. RS data generated pursuant to the predetermined polynomial shown in FIG. 9 are output per column offset in normal mode (accelerator speed=1) pursuant to sequential ordering, e.g., row1, 2, and 3. In acceleration mode (accelerator speed more than 1), the RS data output per column offset is advanced, for example, by selecting input ports '1' of the selectors of FIG. 8, to output pre-shifted RS data from row3, to reduce the initial seed setup time. When a column offset value increases according to toggling of a clock signal CLK, an initial seed may be also generated sequentially. Although the accelerator feature described according to the present embodiment is to accelerate RS generation by two clock cycles, one skilled in the art can readily appreciate that other configurations similar to the exemplary embodiment described herein can be deployed to vary the accelerator parameter. For example, when speed information indicates 4-speed, initial seeds corresponding to column offset values (for example, 4, 8, 12, . . . ) may be generated sequentially. As in FIG. 8, the "^" in FIG. 9 denotes an exclusive OR operation XOR.

Although various embodiments of the present inventive concept described herein are directed to generating random sequence (RS) data corresponding to offset values, for example, the Nth RS data generated sequentially to mix with data corresponding to an Nth offset value, such RS data and offset value correspondence can be varied. According to an embodiment of the inventive concept, M random sequence (RS) data is generated, wherein M can be smaller than N. For example, the $4^{th}$ RS data can be used for an offset value of 5. Thus, the maximum value of M is N.

According to another embodiment of the inventive concept, M random sequence data is generated prior to derandomizing first read data based on the access address, wherein M is a range from 1 to less than the end of the column portion of the access address.

Figure 10:
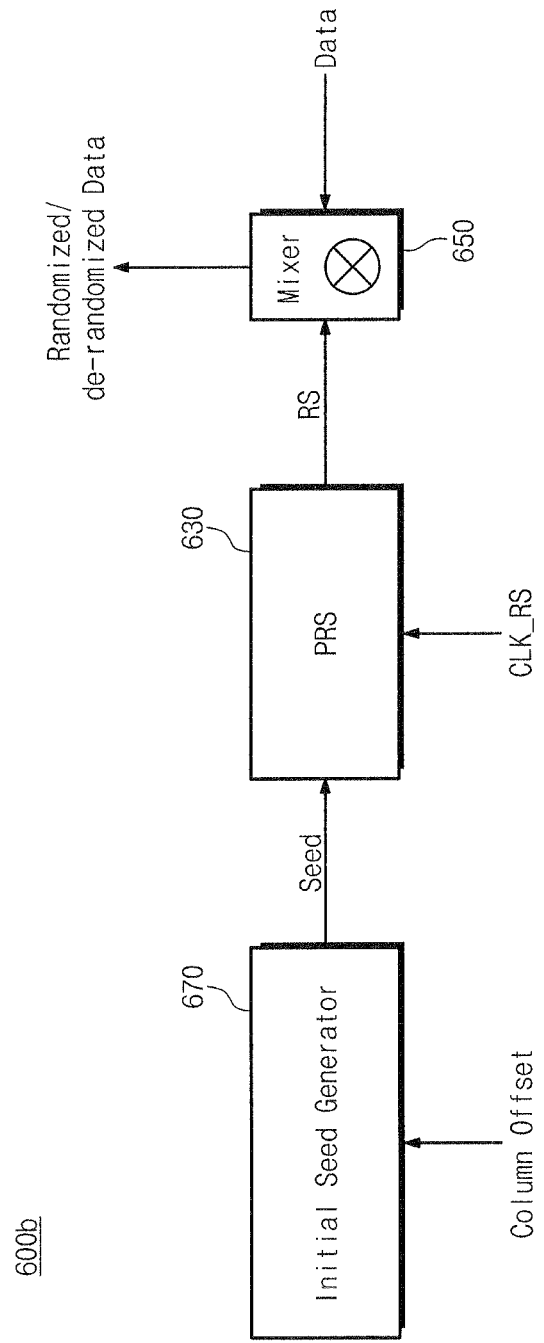
FIG. 10 is a block diagram showing a randomizer circuit in FIG. 1 according to still another exemplary embodiment of the inventive concept.

FIG. 10 is a block diagram showing a randomizer circuit in FIG. 1 according to still another exemplary embodiment of the inventive concept.

Prior to description, in a randomizer circuit 600b illustrated in FIG. 10, constituent elements which have the same functions as those illustrated in FIG. 3 are marked by the same reference numerals, and description thereof is thus omitted.

Referring to FIG. 10, the randomizer circuit 600b includes an initial seed generator 670, which generates an initial seed based upon a column offset value. A PSR 630 may implement according to a polynomial of $X^{11}+X^{10}+1$ for generating initial seeds illustrated in FIG. 9. As described above, initial seed values of the PSR 630 can be generated based on predetermined conditions. Accordingly, the initial seed generator 670 may be implemented in hardware, essentially as illustrated in FIG. 8. The PSR 630 and the initial seed generator 670 may constitute a block of generating a random sequence.

In an exemplary embodiment, a random sequence clock signal CLK_RS applied to the PSR 630 may be a read/write enable signal toggled at a data input/output. Alternatively, a random sequence clock signal CLK_RS applied to the PSR 630 may be a clock signal generated at a data input/output.

Figure 11A:
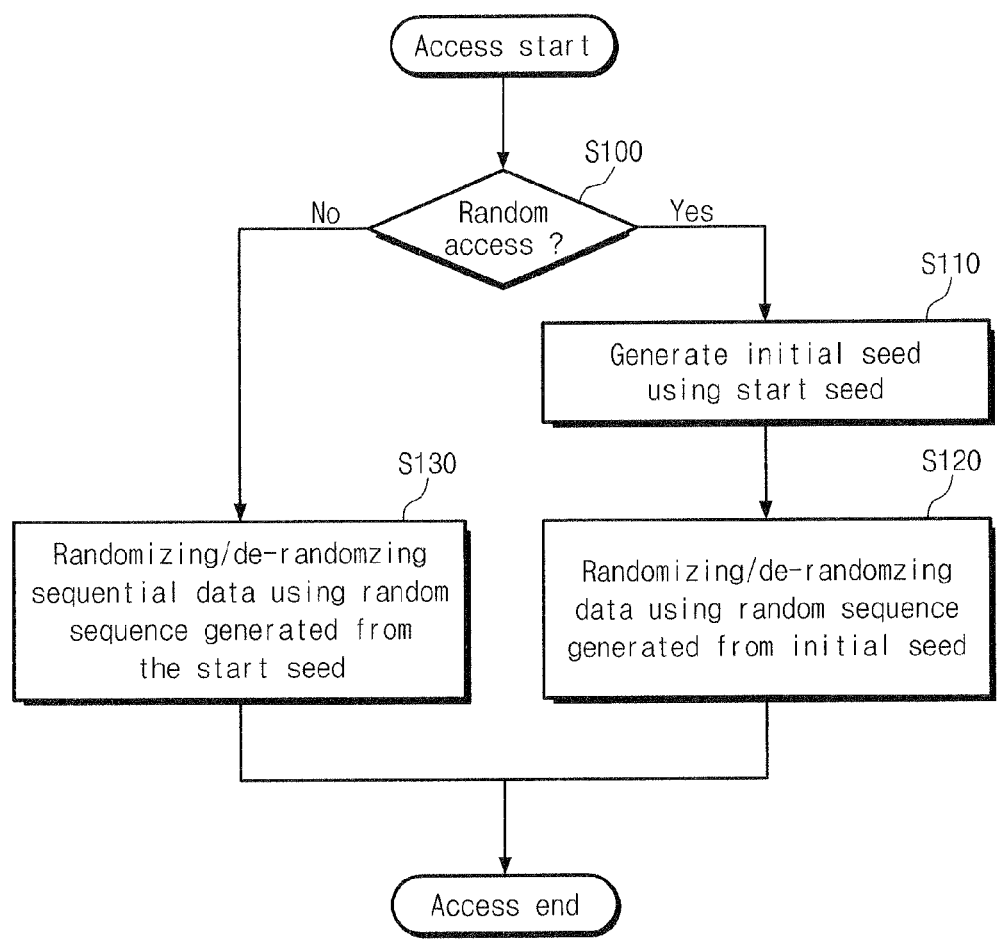
FIG. 11A is a flow chart for describing a randomizer method of a flash memory device according to an exemplary embodiment of the inventive concept.
Figure 11B:
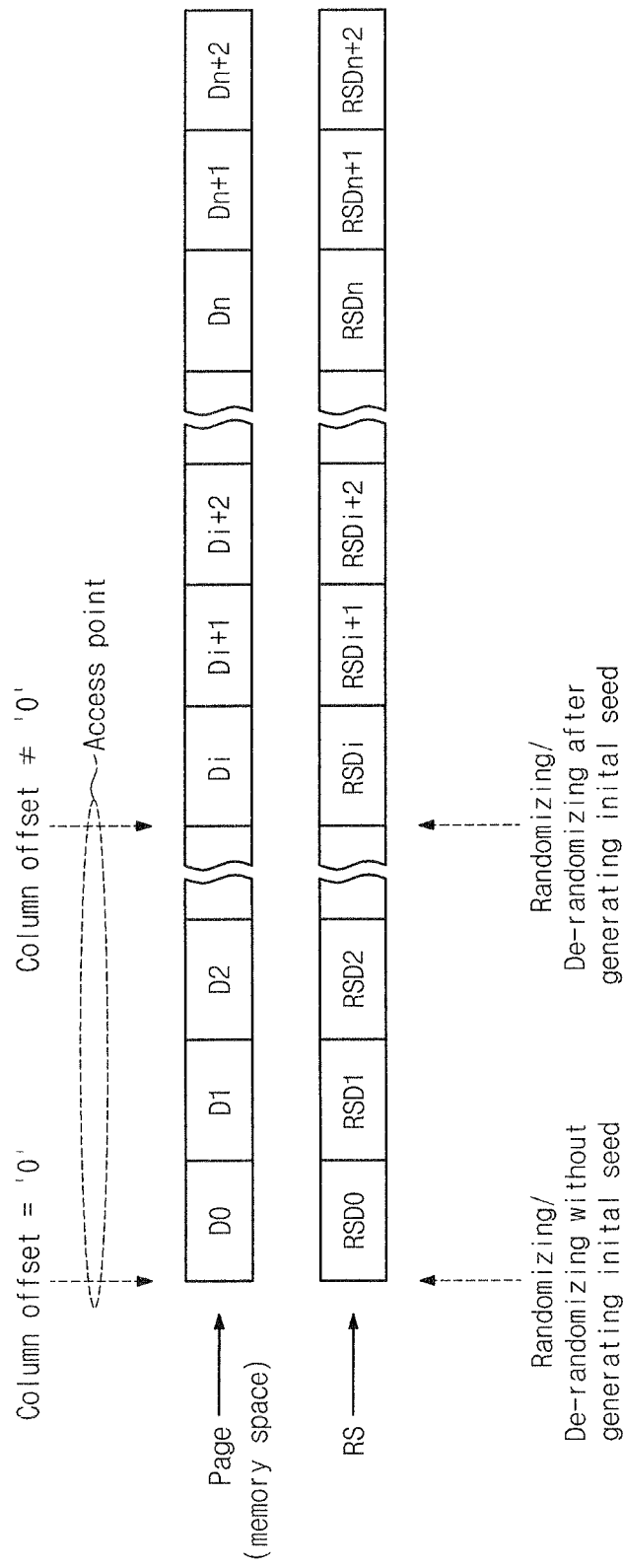
FIG. 11B is a diagram for describing a randomizer scheme of a flash memory device according to an exemplary embodiment of the inventive concept.

FIG. 11A is a flow chart for describing a randomizer method of a flash memory device according to an exemplary embodiment of the inventive concept, and FIG. 11B is a diagram for describing a randomizer scheme of a flash memory device according to an exemplary embodiment of the inventive concept.

Upon access start, step S100, it is determined whether a requested access is a random data access, e.g., by checking the column address or offset value. If a random data access is determined, e.g., offset not '0', the method proceeds to step S110, in which there is generated an initial seed, by using a portion of the access address, such as the page address, as the start seed fed into the PRS 630. After an initial seed is generated, in step S120, a random sequence RSDi^RSDn+1 is generated using the initial seed thus prepared, and a randomizing/de-randomizing operation is carried out using the random sequence RSDi^RSDn+1. Randomized data may be stored in an array 100 through a page buffer circuit 400. De-randomized data may be provided to an external device (for example, a controller) through an input/output interface 700.

If the requested access is determined to be a nonrandom data access, (column offset is '0') the method proceeds to step S130, and randomizing/de-randomizing operation is performed from the first data D0, a random sequence RSD0^RSDn+1 is generated based upon a start seed determined according to an address, e.g., a page address, a block address, or sector address, etc., without an initial seed generating operation described in FIGS. 3 to 10. Randomized data may be stored in the array 100 through the page buffer circuit 400. De-randomized data may be provided to the external device (for example, a controller) through the input/output interface 700.

Although various embodiments of the present inventive concept above described uses column address and offset to illustrate random access, (e.g., when column offset is non-zero), the use of a start seed can be based on other random access unrelated to column offset. For example, the minimum access unit of read and write from/to flash memory can be by sector, such as a combination of program data and ECC, and the start seed used for sectors except the first sector may not relate to the column address.

In an exemplary embodiment, randomizing/de-randomizing performed through a mixer may be made not only by a binary unit but also with respect to a multi-value state through a bit-wise XOR operation.

Figure 12:
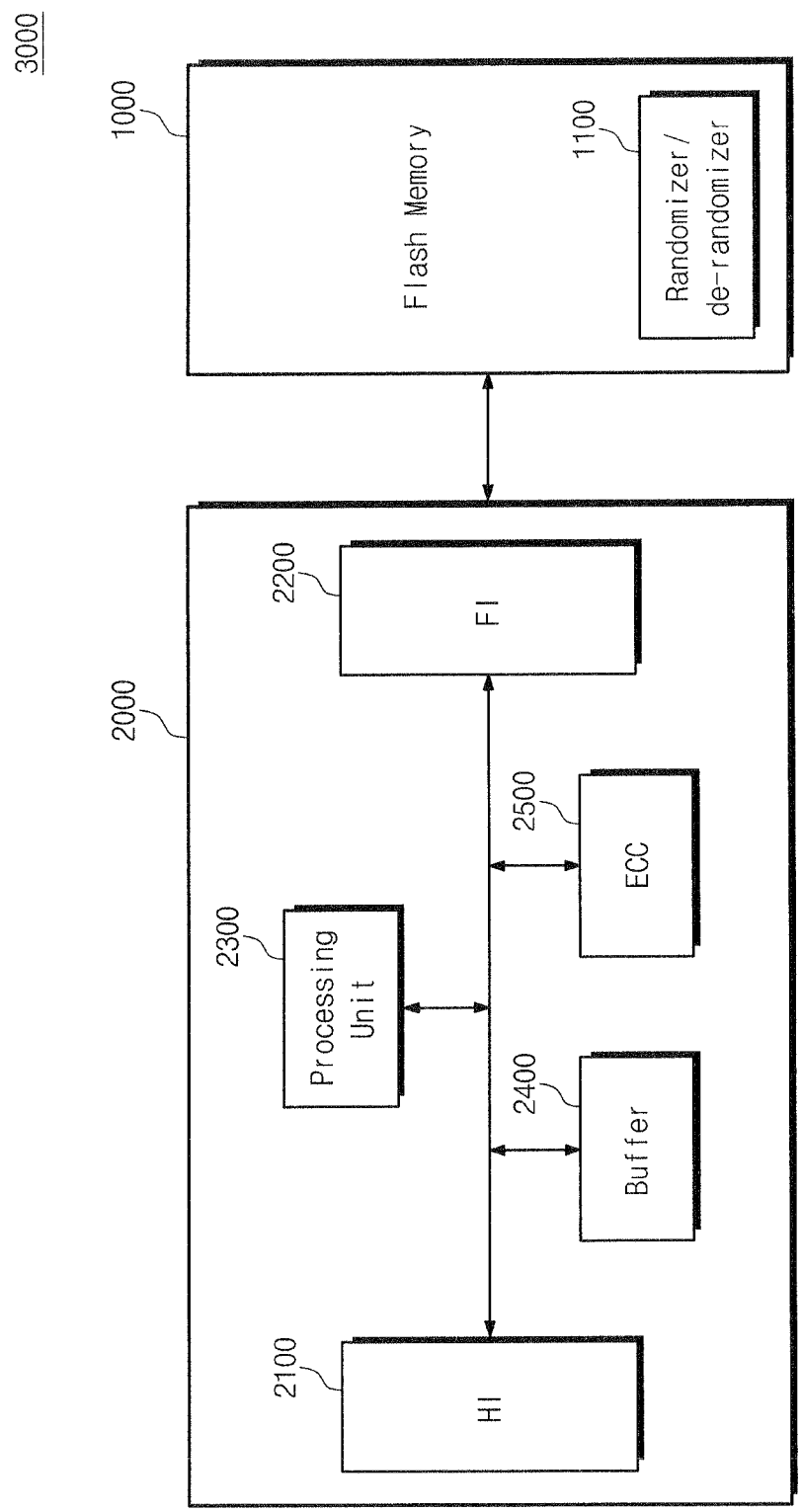
FIG. 12 is a block diagram showing a memory system according to an exemplary embodiment of the inventive concept.

FIG. 12 is a block diagram showing a memory system according to an exemplary embodiment of the inventive concept.

Referring to FIG. 12, a memory system 3000 includes at least one flash memory 1000 and a controller 2000. The flash memory 1000 operates under the control of the controller 2000 and is used as a storage media. The controller 2000 may be configured to control the flash memory 1000. The flash memory 1000 may include a randomizer circuit 1100. The flash memory 1000 in FIG. 12 is substantially identical to that illustrated in FIG. 1, and description thereof is thus omitted. The controller 2000 may be configured to add ECC data to be stored in the flash memory 1000.

The controller 2000 may include the first interface 2100, the second interface 2200, a processing unit 2300, a buffer memory 2400, and an ECC block 2500. The first interface 2100 is configured to interface with an external device (for example, a host), and the second interface 2200 is configured to interface with the flash memory 2200. The processing unit 2300 is configured to control an overall operation of the controller 2000. The buffer memory 2400 is configured to store data to be stored in the flash memory 1000 or data read out from the flash memory 1000. The ECC block 2500 generates ECC data based upon data from the buffer memory 2400. The ECC block 2600 performs error detecting and correcting operations with respect to data read from the flash memory 1000. The ECC data may be stored in the same page as data to be stored in the flash memory 1000 or in a region different from data to be stored in the flash memory 1000.

In case of a memory system illustrated in FIG. 12, a write operation may include generating ECC data based upon data to be stored in the flash memory 1000 and randomizing data to be stored in the flash memory 1000. A read operation may include de-randomizing read data and performing error detecting and correcting operations with respect to the de-randomized data. Randomizing/de-randomizing on the ECC data can be made selectively.

In an exemplary embodiment, the first interface 2100 of the controller 2000 may be formed of one of computer bus standards, storage bus standards, and iFCPPeripheral bus standards, or a combination of two or more standards. The computer bus standards may includes S-100 bus, Mbus, Smbus, Q-Bus, ISA, Zorro II, Zorro III, CAMAC, FASTBUS, LPC, EISA, VME, VXI, NuBus, TURBOchannel, MCA, Sbus, VLB, PCI, PXI, HP GSC bus, CoreConnect, InfiniBand, UPA, PCI-X, AGP, PCIe, Intel QuickPath Interconnect, Hyper Transport, etc. The storage bus standards may include ST-506, ESDI, SMD, Parallel ATA, DMA, SSA, HIPPI, USB MSC, FireWire(1394), Serial ATA, eSATA, SCSI, Parallel SCSI, Serial Attached SCSI, Fibre Channel, iSCSI, SAS, RapidIO, FCIP, etc. The iFCPPeripheral bus standards may include Apple Desktop Bus, HIL, MIDI, Multibus, RS-232, DMX512-A, EIA/RS-422, IEEE-1284, UNI/O, 1-Wire, I2C, SPI, EIA/RS-485, USB, Camera Link, External PCIe, Light Peak, Multidrop Bus, etc.

Figure 13:
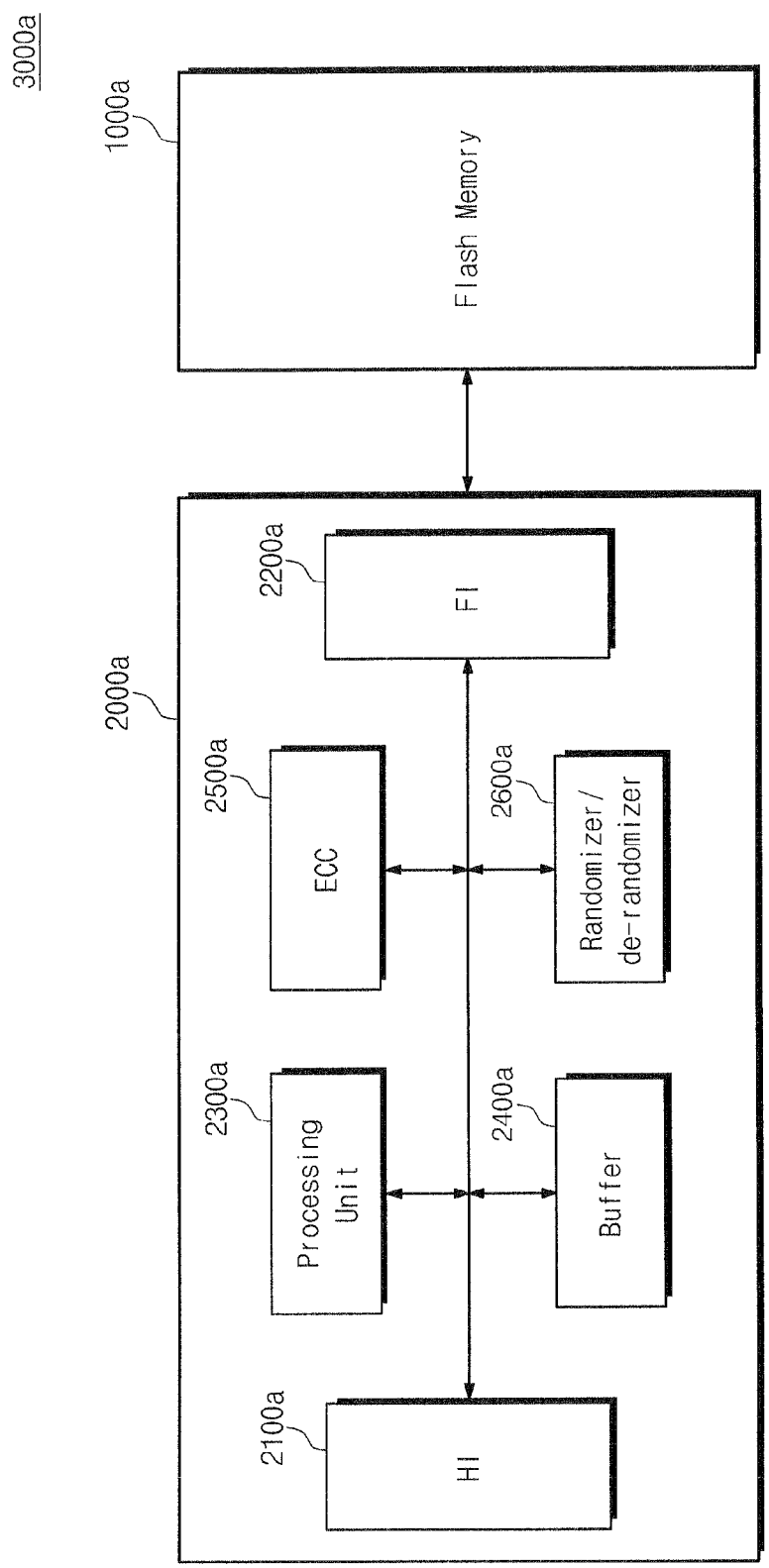
FIG. 13 is a block diagram showing a memory system according to another exemplary embodiment of the inventive concept.

FIG. 13 is a block diagram showing a memory system according to another exemplary embodiment of the inventive concept.

Referring to FIG. 13, a memory system 3000a includes at least one flash memory 1000a and a controller 2000a. The flash memory 1000a operates under the control of the controller 2000a and is used as a storage media. The flash memory 1000a illustrated in FIG. 13 does not include the above-described randomizer circuit. The controller 2000a may be configured to control the flash memory 1000a. The controller 2000a is configured to randomize data to be stored in the flash memory 1000a and to add ECC data to the randomized data. The controller 2000a is configured to perform detecting and correcting operations with respect to errors of randomized data read out from the flash memory 1000a and to de-randomize randomized data.

The controller 2000a may include the first interface 2100a, the second interface 2200a, a processing unit 2300a, a buffer memory 2400a, an ECC block 2500a, and a randomizer block 2600. The constituent elements 2100a, 2200a, 2300a, 2400a, and 2500a illustrated in FIG. 13 are substantially identical to those in FIG. 12, and description thereof is thus omitted.

The randomizer block 2600 is configured to randomize data from the buffer memory 2400a and to de-randomize data (that is, randomized data) read out from the flash memory 1000a. The randomizer block 2600 may perform randomizer operations with respect to random data according to any one of manners described in FIGS. 3 to 10, and description thereof is thus omitted. The ECC block 2600 may generate ECC data based upon randomized data from the randomizer block 2500. The ECC block 2500a may perform error detecting and correcting operations on data read from the flash memory 1000a, that is, randomized data, based upon ECC data. The ECC data may be stored in the same page as data to be stored in the flash memory 1000a or in a region different from data to be stored in the flash memory 1000a.

In case of a memory system in FIG. 13, a write operation may include randomizing data to be stored in the flash memory 1000a, generating ECC data based on the randomized data, and storing the randomized data and the ECC data in the flash memory 1000. Alternatively, a write operation may include randomizing both data to be stored and ECC data and storing the randomized result. A read operation may include performing error detecting and correcting operations with respect to read data (that is, randomized data) based on ECC data and randomizing the read data.

Figure 14:
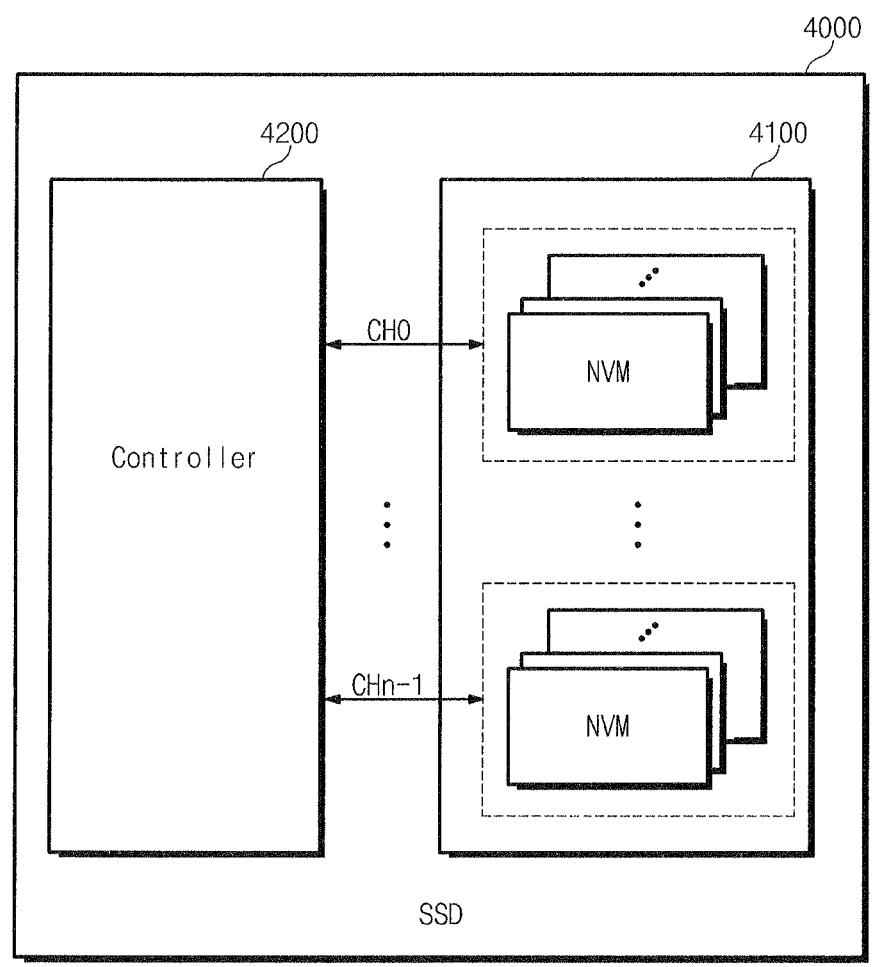
FIG. 14 is a block diagram showing a solid state drive according to an exemplary embodiment of the inventive concept.

FIG. 14 is a block diagram showing a solid state drive according to an exemplary embodiment of the inventive concept.

Referring to FIG. 14, a solid state drive (SSD) 4000 comprises a storage media 4100 and a controller 4200. The storage media 4100 is connected with the controller 4200 via a plurality of channels, each of which is commonly connected with a plurality of non-volatile memories. Each non-volatile memory device may be formed of a flash memory device described in FIG. 1. In this case, the controller 4200 may be configured to be substantially identical to that described in FIG. 12. That is, data randomizer may be made within each non-volatile memory, and error detecting and correcting may be made within the controller 4200.

Alternatively, the controller 4200 may be configured to be identical to that described in FIG. 13. In this case, data randomizer and error detecting and correcting may be made within the controller 4200. Accordingly, it is possible to generate an initial seed for random data with reference to an offset address.

Figure 15:
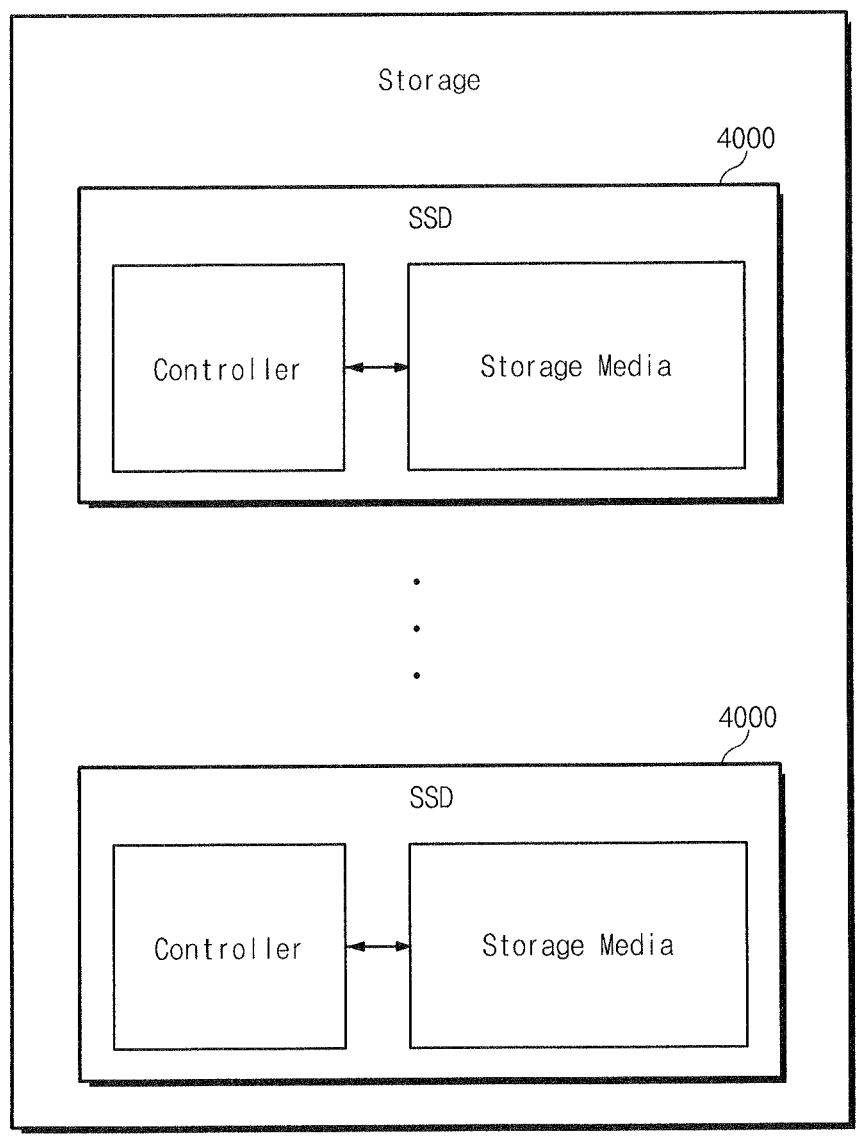
FIG. 15 is a block diagram showing storage using a solid state drive illustrated in FIG. 14.
Figure 16:
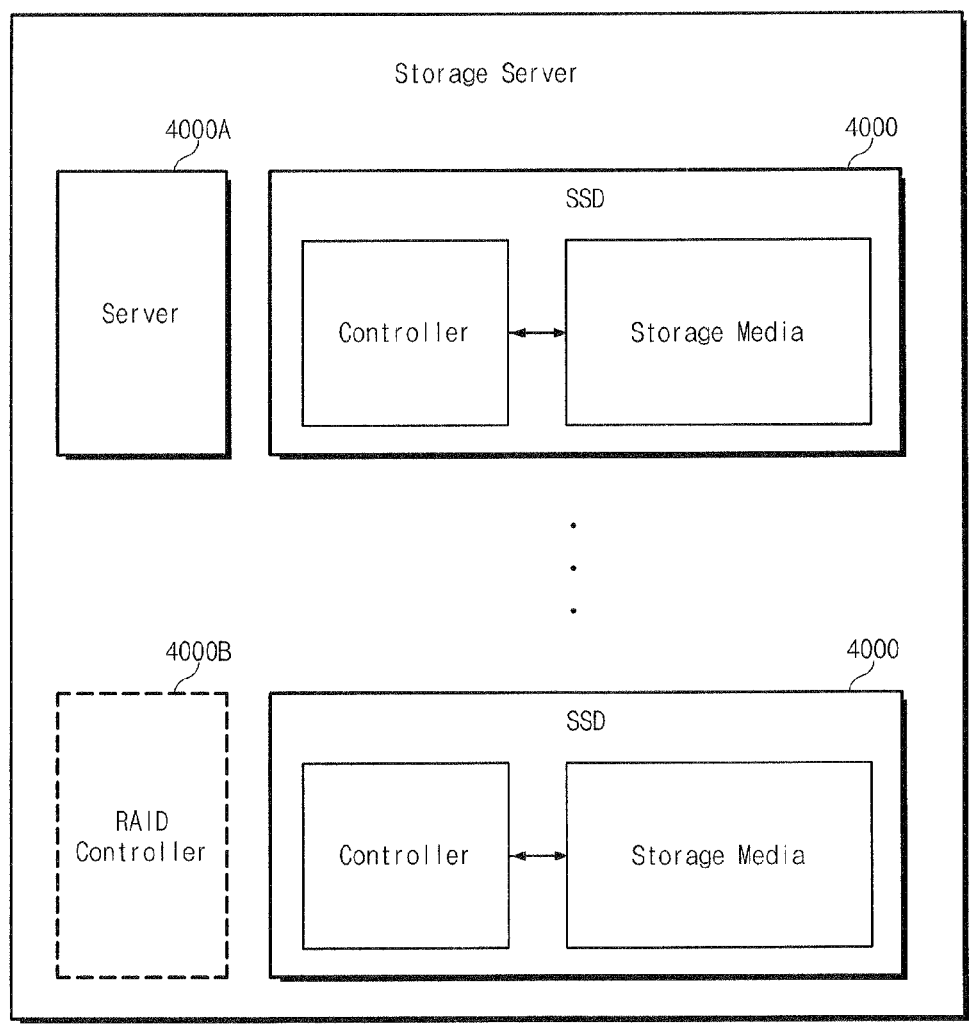
FIG. 16 is a block diagram showing a storage server using a solid state drive illustrated in FIG. 14.

FIG. 15 is a block diagram showing storage using a solid state drive illustrated in FIG. 14, and FIG. 16 is a block diagram showing a storage server using a solid state drive illustrated in FIG. 14.

An SSD 4000 according to an exemplary embodiment of the inventive concept is used to configure storage. As illustrated in FIG. 15, storage includes a plurality of solid state drives 4000 which are configured to be substantially identical to that described in FIG. 14. The SSD 4000 according to an exemplary embodiment of the inventive concept is used to configure a storage sever. As illustrated in FIG. 16, a storage server includes a plurality of solid state drives 4000, which are configured to be substantially identical to that described in FIG. 14, and a server 4000A for controlling an overall operation of the storage server. Further, the storage server further includes a RAID controller 4000B for parity management according to a parity manner applied to repair defects on data stored in the solid state drives 4000.

Figure 17:
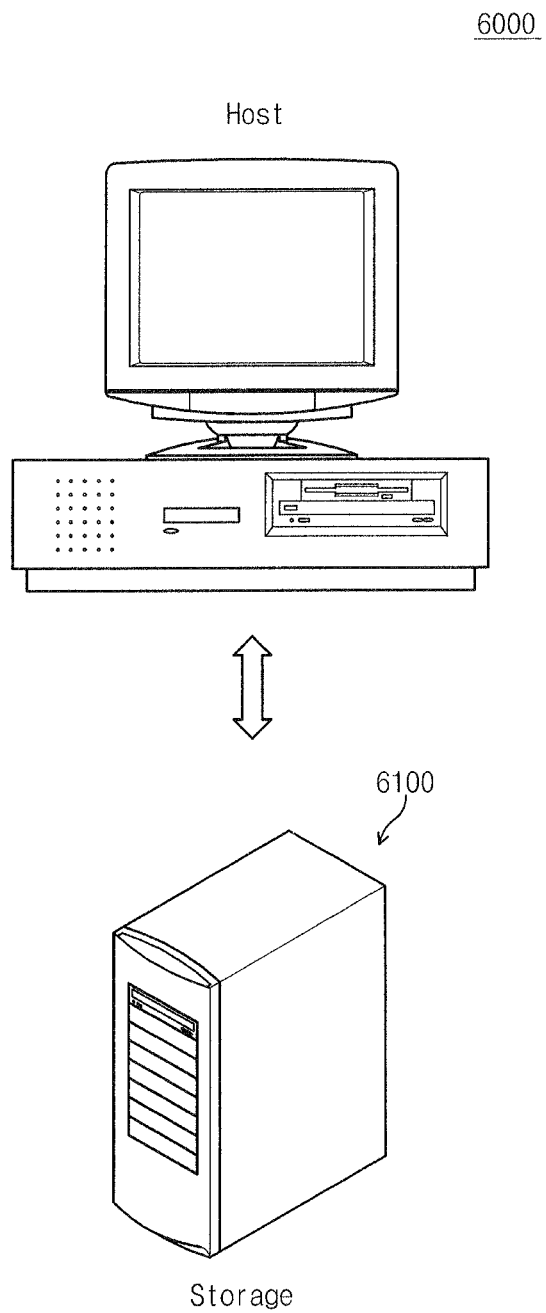
FIGS. 17 to 19 are diagrams showing systems according to exemplary embodiments of the inventive concept.
Figure 18:
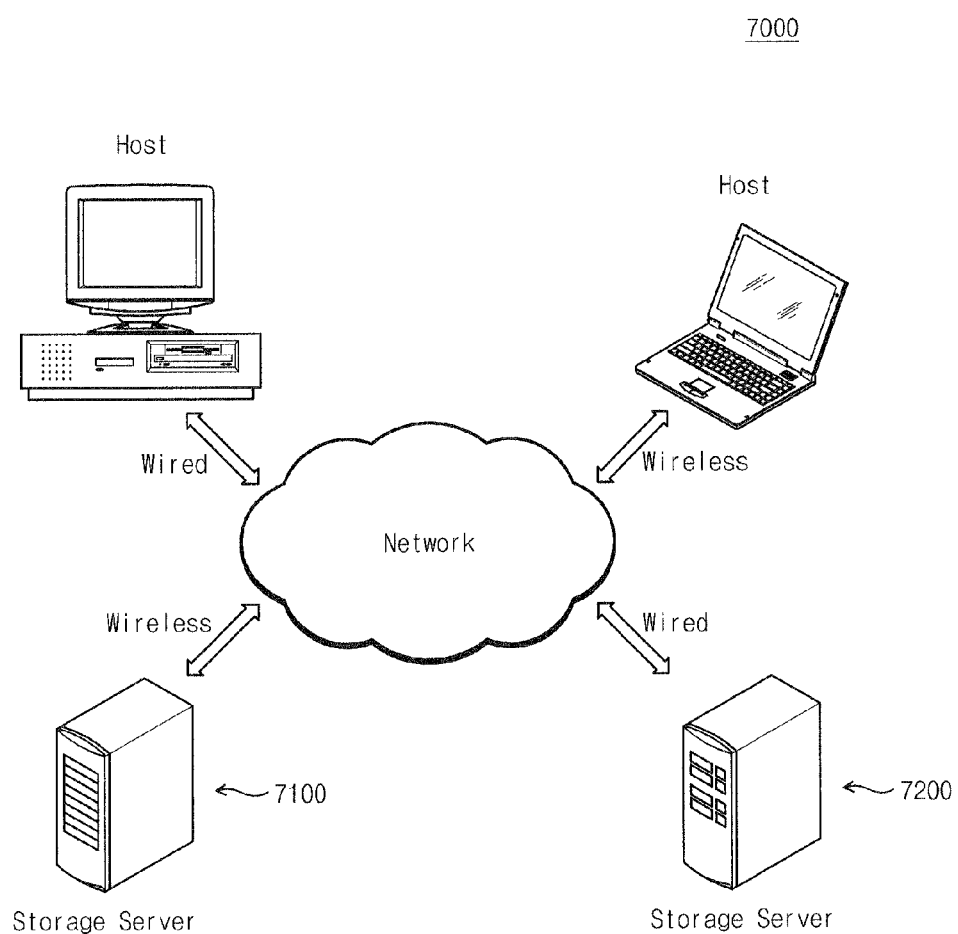
Figure 19:
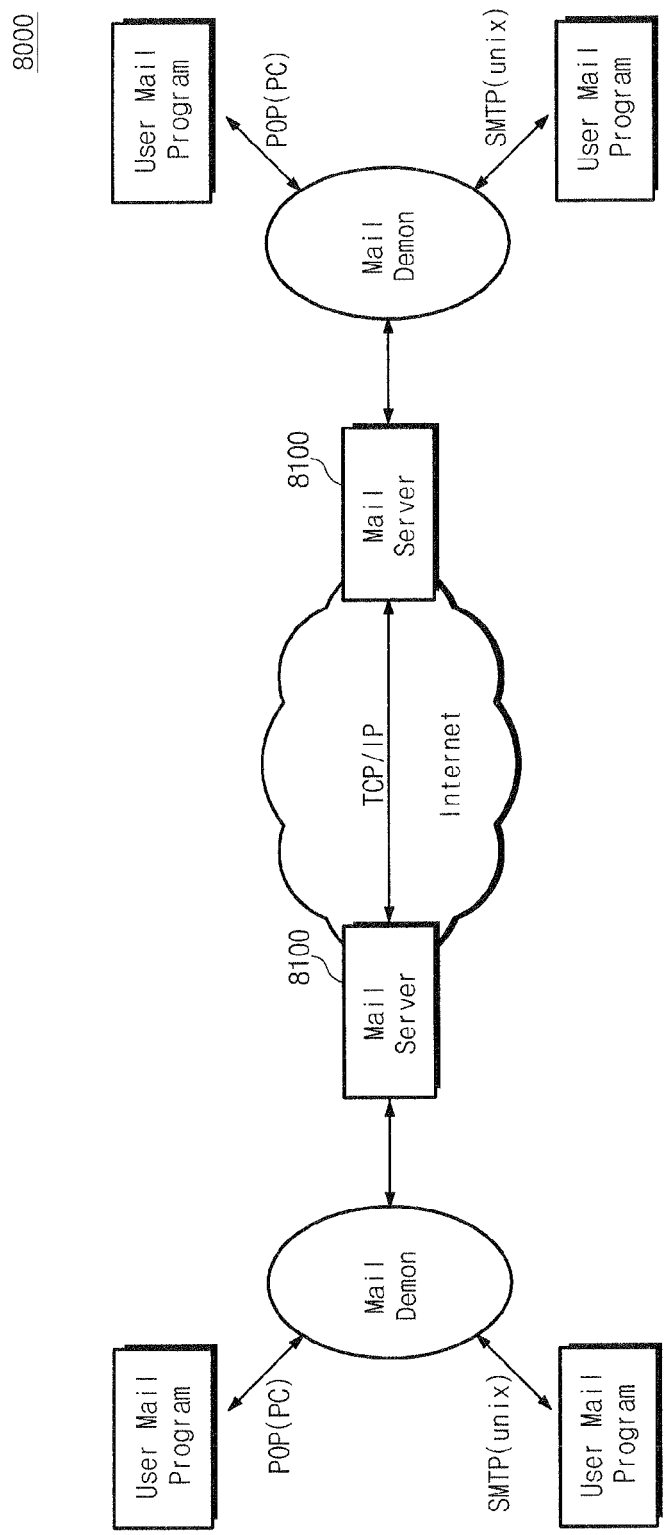

FIGS. 17 to 19 are diagrams showing systems according to exemplary embodiments of the inventive concept.

In the event that a solid state drive including a memory controller and flash memory devices according to exemplary embodiments of the inventive concept is applied to storage, as illustrated in FIG. 17, a system 600 includes a storage 6100 which communicates with a host by wire or wireless manner. In a case where a solid state drive including a data storage device according to exemplary embodiments of the inventive concept is applied to a storage server, as illustrated in FIG. 18, a system 7000 includes storage servers 7100 and 7200 which communicate with a host by wire or wireless manner. Further, as illustrated in FIG. 19, a solid state drive including a data storage device according to exemplary embodiments of the inventive concept can be applied to a mail server 8100. The mail server 8100 may communicate with mail programs via a mail demon connected in POP and SMTP manners, and the mail servers 8100 may communicate through an internet network.

FIGS. 20 to 24 are diagrams showing other systems to which a non-volatile memory device according to an exemplary embodiment of the inventive concept is applied.

Figure 20:
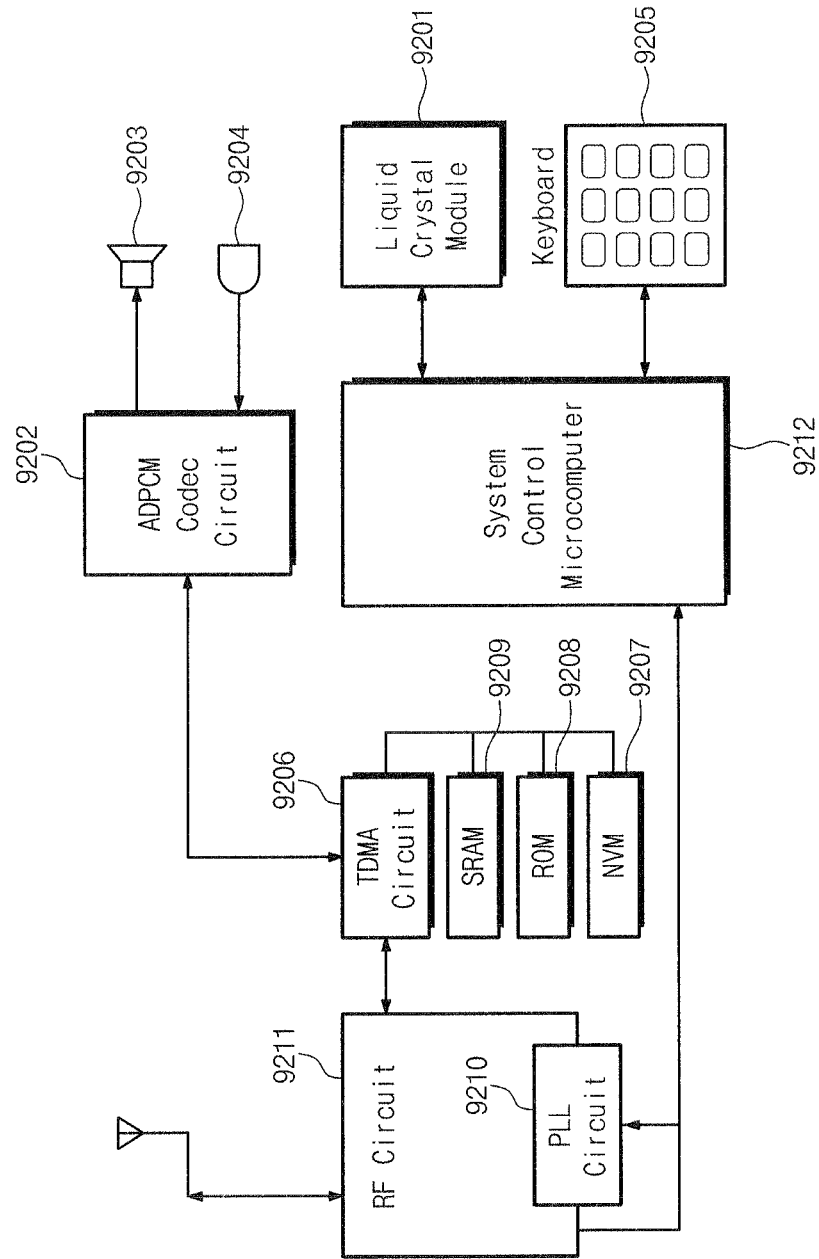
FIGS. 20 to 24 are diagrams showing other systems to which a non-volatile memory device according to an exemplary embodiment of the inventive concept is applied.

FIG. 20 is a block diagram illustrating a cellular phone system to which a flash memory device according to an exemplary embodiment of the inventive concept is applied. Referring to FIG. 20, a cellular phone system may include an ADPCM codec circuit 9202 for compressing a voice and decompressing a compressed voice, a speaker 9203, a microphone 9204, a TDMA circuit 9206 for time-division multiplexing digital data, a PLL circuit 9210 configured to set a carrier frequency of a radio frequency signal, an RF circuit 9211 configured to send and receive a radio frequency signal, and the like.

Further, the cellular phone system may include various types of memories, such as the non-volatile memory device 9207, the ROM 9208, and the SRAM 9209. The non-volatile memory device 9207 may be formed of a flash memory device as described in FIG. 1, and randomizing/derandomizing operations performed as described with FIGS. 3 to 10. The ROM 9208 may be used to store programs, and the SRAM 9209 may be used as a work region for the system control microcomputer 9212 or/and to temporarily store data. The system control microcomputer 9212 is a processor which is configured to control write and read operations of the non-volatile memory device 9207.

Figure 21:
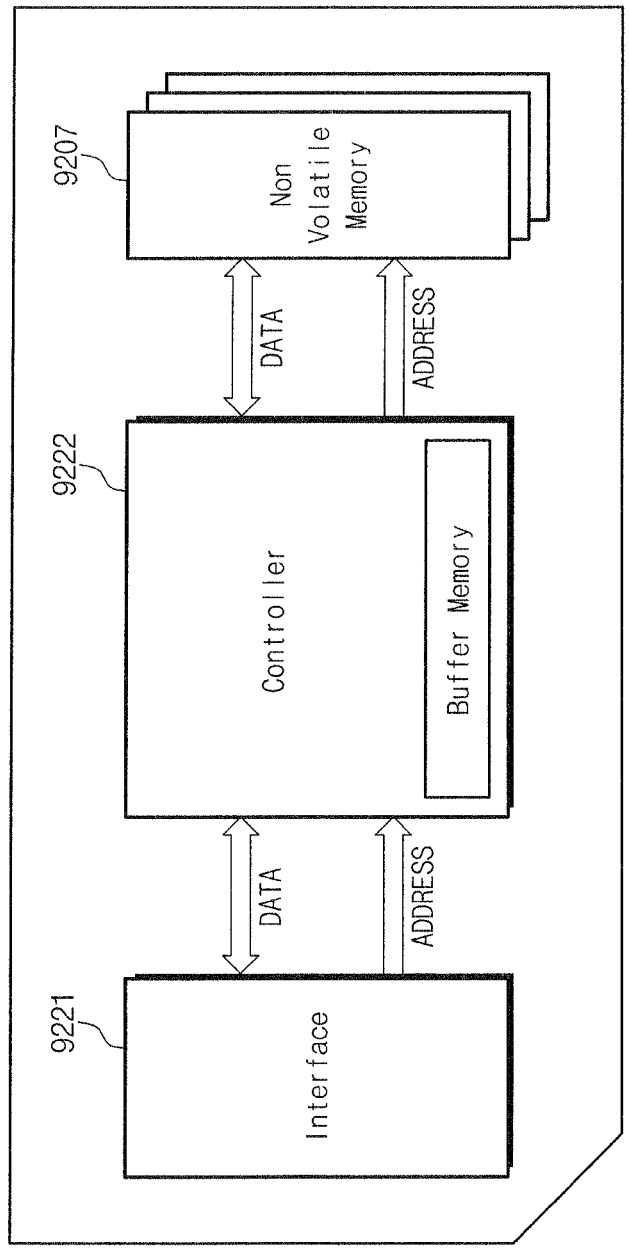

FIG. 21 is a block diagram illustrating a memory card to which a flash memory device according to an exemplary embodiment of the inventive concept is applied. A memory card, for example, may be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 21, the memory card may include an interface circuit 9221 for interfacing with an external device, a controller 9222 including a buffer memory and controlling an operation of the memory card, and at least one flash memory device 9207 according to an exemplary embodiment of the inventive concept. The flash memory device 9207 may be formed of a flash memory device which is configured to generate an initial seed for random data. The controller 9222 may be a processor which is configured to control write and read operations of the flash memory device 9207. In particular, the controller 9222 may be coupled with the non-volatile memory device 9207 and the interface circuit 9221 via a data bus DATA and an address bus ADDRESS.

Figure 22:
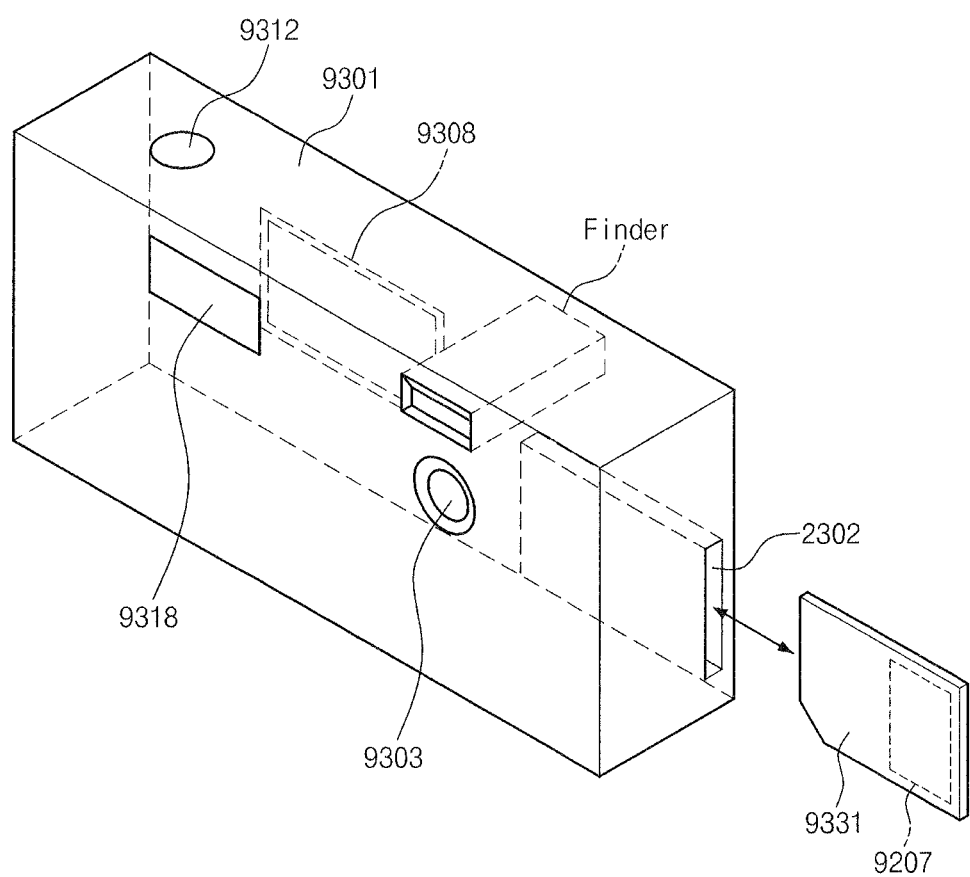

FIG. 22 is a block diagram illustrating a digital still camera to which a flash memory device according to an exemplary embodiment of the inventive concept is applied. Referring to FIG. 22, a digital still camera may include a body 9301, a slot 9302, a lens 9303, a display circuit 9308, a shutter button 9312, a strobe 9318, and the like. In particular, a memory card 9331 may be inserted in the slot 9308 and include at least one flash memory device 9207 according to an exemplary embodiment of the inventive concept configured to generate an initial seed for random data.

If the memory card 9331 has a contact type, an electric circuit on a circuit board may be electrically contacted with the memory card 9331 when it is inserted in the slot 9308. In the event that the memory card 931 has a non-contact type, an electric circuit on a circuit board may communicate with the memory card 9331 in a radio-frequency manner.

Figure 23:
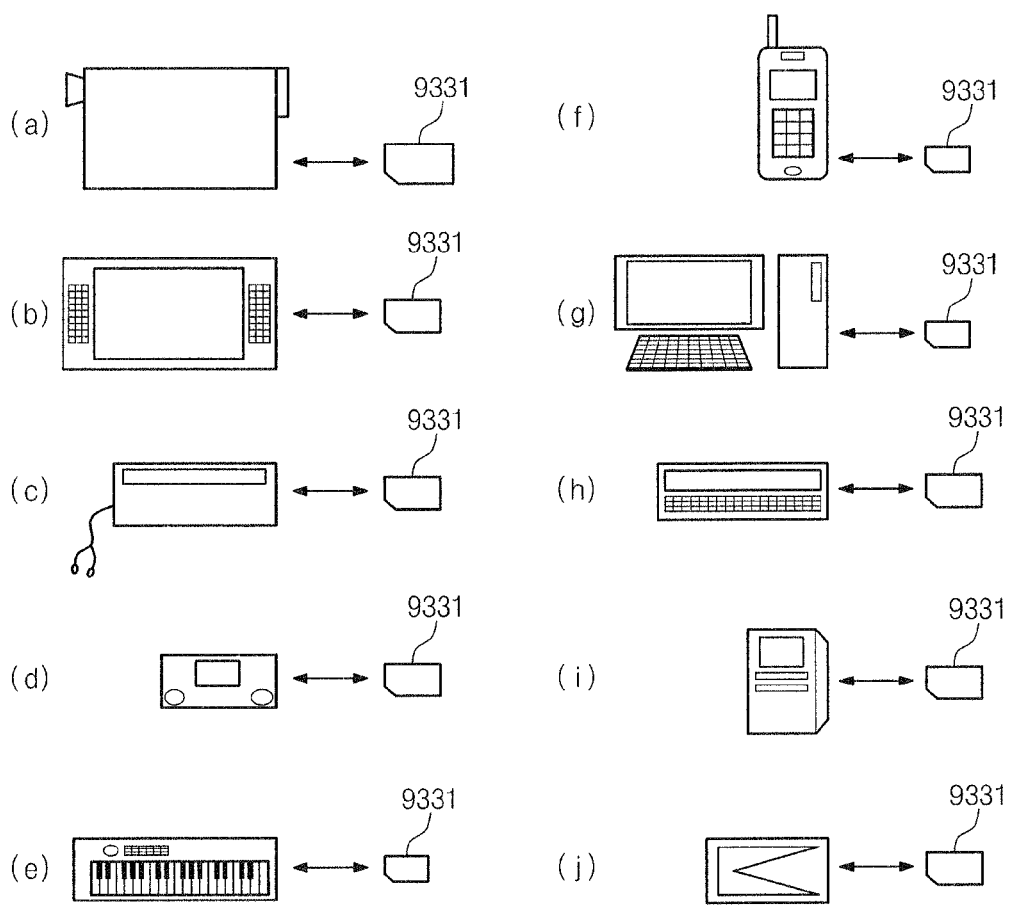

FIG. 23 is a diagram illustrating various systems to which a memory card in FIG. 22 is applied.

Referring to FIG. 23, a memory card 9331 may be applied to (a) a video camera, (b) a television, (c) an audio device, (d) a game machine, (e) an electronic music device, (f) a cellular phone, (g) a computer, (h) a Personal Digital Assistant (PDA), (i) a voice recorder, (j) a PC card, and the like.

Figure 24:
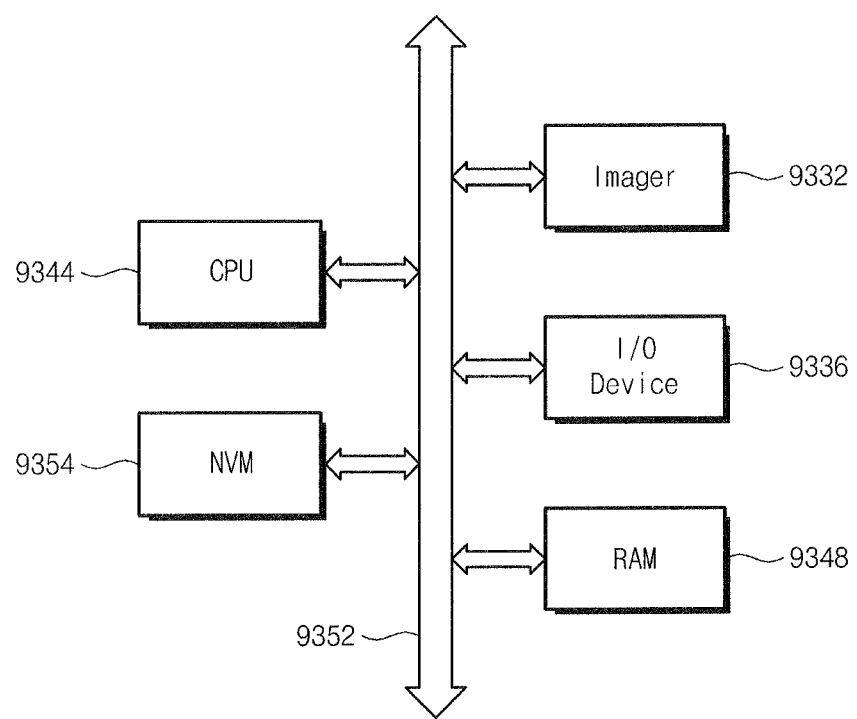

FIG. 24 is a block diagram illustrating an image sensor system to which a flash memory device according to an exemplary embodiment of the inventive concept is applied.

Referring to FIG. 24, an image sensor system may include an image sensor 9332, an input/output device 9336, RAM 9348, CPU 9344, and a flash memory device 9354 according to an exemplary embodiment of the inventive concept. Elements in FIG. 24, that is, the image sensor 9332, the input/output device 9336, the RAM 9348, the CPU 9344, and the flash memory device 9354 may communicate with one another via a bus 9352. The image sensor 9332 may include a photo sensing device such as a photo-gate, photo-diode, or the like. Each element may be formed of a single chip together with a processor or independently from the processor.

In an exemplary embodiment of the inventive concept, memory cells can be formed of a variable resistance memory cell. An exemplary variable resistance memory cell and a memory device including the same are disclosed in U.S. Pat. No. 7,529,124, the entirety of which is incorporated by reference herein.

In another exemplary embodiment of the inventive concept, memory cells are formed of one of various cell structures having a charge storage layer. Cell structures having a charge storage layer include a charge trap flash structure using a charge trap layer, a stack flash structure in which arrays are stacked in a multiple layer, a source-drain free flash structure, a pin-type flash structure, etc.

A memory device having a charge trap flash structure as a charge storage layer is disclosed in U.S. Pat. No. 6,858,906 and U.S. Publication Nos. 2004/0169238 and 2006/0180851, the entirety of which is incorporated by reference herein. A source-drain free flash structure is KR Patent No. 673020, the entirety of which is incorporated by reference herein.

A flash memory device and/or a memory controller according to the inventive concept may be packed using various types of packages. For example, A flash memory device or a memory controller according to the inventive concept may be packed using packages such as PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

We claim:

1. A method of controlling a memory, comprising:
    determining whether data access is random;
    generating a first random sequence (RS) data based on a first seed if data access is not random;
    mixing the first RS data with data read from the memory or data to be written to the memory;
    generating a second seed from the first seed if data access is random;
    generating a second RS data based on the second seed; and
    mixing the second RS data with data read from the memory or data to be written to the memory.

2. The method of claim 1, wherein the first seed is based on one of row address, page address, block unit, or sector unit.

3. The method of claim 1, wherein it is determined that data access is random when a column offset value of the data access is nonzero.

4. The method of claim 1, wherein it is determined that data access is not random when a column offset value of the data access is zero.

5. The method of claim 1, wherein the second RS data includes RS data that satisfy $1+x^{K-1}+x^k$ polynomial.

6. The method of claim 1, further including using the first seed for a first segment, the second seed for an intermediate segment, and a third seed generated based on the first or second seed for a third segment.

7. The method of claim 1, wherein the data to be written is received from an I/O pin and the mixed data is output to a page buffer.

8. The method of claim 1, wherein the data read from the memory and mixed with the second RS data is output to an I/O pin.

9. A method of controlling a memory, comprising:
    receiving an offset address value N, N being a column portion of an access address;
    generating M random sequence (RS) data prior to derandomizing first read data based on the access address, wherein the maximum value of M is N; and
    derandomizing the first read data by mixing with an Nth RS data.

10. The method of claim 9, wherein M=N.

11. The method of claim 9, wherein the generating M RS data includes RS data that satisfy a $1+x^{K-1}+x^k$ polynomial.

12. The method of claim 11, wherein K=11.

13. The method of claim 11, further including accelerating the generating M RS data by selecting a RS data string path that includes pre-shifted outputs.

14. A method of controlling a memory, comprising:
    receiving an offset value N, N being a column portion of an access address;
    generating M random sequence data prior to derandomizing first read data based on the access address, wherein M is a range from 1 to less than the end of the column portion of the access address; and
    derandomizing the first read data using an Nth RS data.

15. The method of claim 14, further including outputting derandomized first data via an I/O pin.

16. A method of controlling a memory, comprising:
    receiving an column offset value N;

generating at least one random sequence (RS) data based on a start seed until a count increased from a predetermined value reaches N;

determining one of said at least one RS data as an initial RS data;

derandomizing data read from the memory or randomizing data to be written to the memory using the initial RS data.

17. The method of claim 16, wherein the start seed is based on one of row address, page address, block unit, or sector unit.

18. The method of claim 16, wherein the predetermined value is zero.

19. The method of claim 16, wherein said at least one RS data includes a RS data that satisfies a $1+x^{K-1}+x^k$ polynomial.

20. The method of claim 18, wherein said determining comprises determining last generated one of said at least one RS data as the initial RS data.

21. The method of claim 18, wherein the derandomized data is output to an I/O pin.

22. The method of claim 18, wherein the data to be written to the memory is received from an I/O pin and the randomized data is output to a page buffer.

23. The method of claim 18, further including accelerating the generation of said at least one RS data by selecting a RS data string path that includes pre-shifted outputs.

24. A memory device, comprising:
a flash memory cell array;
a random sequence (RS) data generator configured to generate at least one RS data string based on a first seed;
a randomizing circuit configured to mix the RS data with data to be written to the flash memory cell array;
a derandomizing circuit configured to derandomize data read from the flash memory cell array; and
a control circuit configured to control access to the flash memory cell array and activate the RS data generator based on memory access mode, wherein the randomizing circuit and the derandomizing circuit are disposed between a page buffer and an I/O pin;
wherein a portion of memory address is used as the first seed in one mode and a second seed is generated by the RS data generator in a second mode.

25. The device of claim 24, wherein the RS data generator is configured to generate RS data that satisfy $1+x^{k-1}+x^k$ polynomial, wherein k is an integer.

26. The device of claim 24, wherein the RS data generator is configured to output at least one preset RS data upon receipt of an acceleration signal.

27. A memory system comprising:
a memory device comprising:
a flash memory cell array;
a random sequence (RS) circuit configured to generate RS data; and
a mixer configured to mix random sequence (RS) data with data to be written to the flash memory cell array and to derandomize data read from the flash memory cell array;
a memory controller comprising a control circuit configured to control writing to and reading from the flash memory cell array through the mixer; and
at least another memory device comprising a flash memory cell array and a random sequence circuit configured to mix random sequence RS data with data to be written to the flash memory cell array and to derandomize data read from the flash memory cell array.

28. The system of claim 27, wherein the memory controller further includes an error control circuit (ECC) configured to perform error correction functions when reading data from the flash memory cell array.

29. The system of claim 27, wherein the flash memory cell array is a multiple levels per cell (MLC) type.

30. The system of claim 27, wherein the memory device is embodied in an SSD card.

31. The system of claim 27, wherein the memory device and the memory controller are embodied in an SSD card.

32. The system of claim 31, further including a processing device configured to control the SSD card and at least another SSD card.

33. The system of claim 31, further including a server configured to control the SSD card and a RAID controller configured to control another SSD card including parity management functions.

34. The system of claim 32, further including a host processing device configured to communicate with the plurality of SSD cards.

35. The system of claim 34, further including wireless transceivers configured to wirelessly communicate between the host processing device and the plurality of SSD cards.

36. The system of claim 32, further including a network connecting a plurality of processing devices and the plurality of SSD cards.

37. The system of claim 31, further including a cellular transceiver configured to communicate with a cellular network.

38. The system of claim 31, further including an image sensor configured to capture images.

39. A memory device, comprising:
a flash memory cell array;
a random sequence (RS) data generator configured to generate at least one RS data string based on a first seed;
a mixer configured to derandomize data read from the flash memory cell array; and
a control circuit configured to control access to the flash memory cell array and activate the RS data generator based on memory access mode, wherein a portion of memory address is used as the first seed in one mode and a second seed is generated by the RS data generator in a second mode.

40. The device of claim 39, wherein the mixer is further configured to randomize data to be written to the flash memory cell array with RS data.

41. The device of claim 39, wherein the mixer is configured to receive data read from the flash memory cell array through a page buffer and the derandomized data is output via an I/O pin.

42. The device of claim 39, wherein the control circuit is configured to generate an intermediate seed based on the first seed and RS data is generated based on the intermediate seed.

43. The device of claim 39, wherein the flash memory cell array includes multiple levels cell (MLC) type flash.

44. The device of claim 43, wherein the mixer is configured to mix multi-value data by bit-wise XOR operation.

* * * * *